(12) United States Patent
Takeuchi

(10) Patent No.: US 10,199,473 B2
(45) Date of Patent: Feb. 5, 2019

(54) SEMICONDUCTOR DEVICE, ANTENNA SWITCH CIRCUIT, AND WIRELESS COMMUNICATION APPARATUS

(71) Applicant: SONY CORPORATION, Tokyo (JP)

(72) Inventor: Katsuhiko Takeuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/302,619

(22) PCT Filed: Mar. 25, 2015

(86) PCT No.: PCT/JP2015/059124
§ 371 (c)(1),
(2) Date: Oct. 7, 2016

(87) PCT Pub. No.: WO2015/159668
PCT Pub. Date: Oct. 22, 2015

(65) Prior Publication Data
US 2017/0025510 A1  Jan. 26, 2017

(30) Foreign Application Priority Data

Apr. 17, 2014 (JP) ................................ 2014-085263

(51) Int. Cl.
| H04B 7/00 | (2006.01) |
| H01L 29/423 | (2006.01) |
| H01L 29/778 | (2006.01) |
| H01L 29/10 | (2006.01) |
| H01L 29/417 | (2006.01) |
| H04B 1/44 | (2006.01) |

(52) U.S. Cl.
CPC ...... *H01L 29/4238* (2013.01); *H01L 29/1066* (2013.01); *H01L 29/41758* (2013.01); *H01L 29/42316* (2013.01); *H01L 29/42376* (2013.01); *H01L 29/7785* (2013.01); *H04B 1/44* (2013.01)

(58) Field of Classification Search
CPC ............ H01L 29/4238; H01L 29/1066; H01L 29/41758; H01L 29/42316
See application file for complete search history.

(56) References Cited

FOREIGN PATENT DOCUMENTS

| JP | 9-181642 A | 7/1997 |
| JP | 2002-118123 A | 4/2002 |
| JP | 2002-373986 | 12/2002 |
| JP | 2012-28977 A | 2/2012 |

OTHER PUBLICATIONS

International Search Report prepared by the Japan Patent Office dated Apr. 15, 2015, for International Application No. PCT/JP2015/059124.

*Primary Examiner* — Tuan Pham
(74) *Attorney, Agent, or Firm* — Sheridan Ross P.C.

(57) ABSTRACT

Provided is a semiconductor device that includes a drain electrode and a source electrode, a gate electrode, one or more gate-electrode extensions, and a link. The drain electrode and the source electrode have a planar shape of combs in mesh with each other. The gate electrode is provided between the drain electrode and the source electrode, and has a meandering planar shape. The one or more gate-electrode extensions are projected from the gate electrode. The link is confronted with one or both of the drain electrode and the source electrode, and couples the one or more gate-electrode extensions together.

12 Claims, 25 Drawing Sheets

SEMICONDUCTOR DEVICE, ANTENNA SWITCH CIRCUIT, AND WIRELESS COMMUNICATION APPARATUS

CROSS REFERENCE TO RELATED APPLICATIONS

The application is a national stage application under 35 U.S.C. 371 and claims the benefit of PCT Application No. PCT/JP2015/059124 having an international filing date of 25 Mar. 2015, which designated the United States, which PCT application claimed the benefit of Japanese Patent Application No. 2014-085263 filed 17 Apr. 2014, the disclosures of which are incorporated herein by reference in their entirety.

TECHNICAL FIELD

The disclosure relates to a semiconductor device, an antenna switch circuit, and a wireless communication apparatus. Specifically, the disclosure relates to a semiconductor device including a gate electrode disposed in a meandering shape between a source electrode and a drain electrode, an antenna switch circuit including the semiconductor device, and a wireless communication apparatus including the antenna switch circuit.

BACKGROUND ART

A mobile terminal device used in a mobile communication system, e.g., a mobile phone, may be provided with a switch circuit (a radio frequency switch circuit) that performs switching of radio frequency signals. Such a radio frequency switch circuit may adopt a multistage-coupling configuration in which switching elements such as GaAs-based FETs (Field Effect Transistors) may be coupled in series. This allows for suppression of signal distortion upon input of a radio frequency signal of large electric power (large amplitude), leading to an increase in maximum electric power to be handled.

In the multistage-coupling configuration, simply increasing the number of stages of FETs may lead to inconvenience such as greater insertion loss because of an increase in ON resistance of the FETs. One of known methods of enhancing the maximum electric power to be handled, without a significant increase in the number of stages of the FETS, is a technique of inserting an additional capacitor between a gate electrode and a drain electrode, or between the gate electrode and a source electrode, of the FET. For example, Patent Literature 1 proposes forming an additional-capacitor strip projected from a bend of a gate electrode of a meandering shape, to form an additional capacitor Cadd/2 between the additional-capacitor strip and the a drain electrode (or a source electrode).

CITATION LIST

Patent Literature

Patent Literature 1: JP 2012-28977A

SUMMARY OF INVENTION

In the configuration of Patent Literature 1, however, two adjacent additional capacitors Cadd/2 are coupled together by a narrow wiring of the gate electrode. This may cause inconvenience of an increase in a resistance component and an inductance component.

It is therefore desirable to provide a semiconductor device that makes it possible to suppress an increase in a resistance component and an inductance component generated in a gate electrode when an additional capacitor is coupled to the gate electrode, an antenna switch circuit including the semiconductor device, and a wireless communication apparatus including the antenna switch circuit.

A semiconductor device according to an embodiment of the disclosure includes the following components (A) to (D).

(A) a drain electrode and a source electrode that have a planar shape of combs in mesh with each other (B) a gate electrode that is provided between the drain electrode and the source electrode, and has a meandering planar shape (C) one or more gate-electrode extensions that are projected from the gate electrode (D) a link that is confronted with one or both of the drain electrode and the source electrode, and couples the one or more gate-electrode extensions together In the semiconductor device according to the embodiment of the disclosure, the one or more gate-electrode extensions are projected from the gate electrode. The one or more gate-electrode extensions are coupled together by the link. The link is confronted with the drain electrode (or the source electrode). An additional capacitor is formed between the link and the drain electrode (or the source electrode).

Here, the one or more gate-electrode extensions are coupled together by the link. The one or more gate-electrode extensions are therefore coupled together by the link having a short wiring length and a large width. Hence, it is possible to suppress the increase in the resistance component and the inductance component generated in the gate electrode when the additional capacitor is coupled to the gate electrode.

An antenna switch circuit according to an embodiment of the disclosure includes a first terminal, a second terminal, a third terminal, a first switching element, and a second switching element. The first terminal is supplied with a transmission signal. The second terminal is coupled to an antenna. The third terminal outputs a reception signal received by the antenna. The first switching element is coupled between the first terminal and the second terminal. The second switching element is coupled between the second terminal and the third terminal. The first switching element becomes conductive while the second switching element becomes non-conductive during transmission. The first switching element becomes non-conductive while the second switching element becomes conductive during reception. One or both of the first switching element and the second switching element includes the following components (A) to (D).

(A) a drain electrode and a source electrode that have a planar shape of combs in mesh with each other (B) a gate electrode that is provided between the drain electrode and the source electrode, and has a meandering planar shape (C) one or more gate-electrode extensions that are projected from the gate electrode (D) a link that is confronted with one or both of the drain electrode and the source electrode, and couples the one or more gate-electrode extensions together In the antenna switch circuit according to the embodiment of the disclosure, during transmission, the first switching element becomes conductive, while the second switching element becomes non-conductive. This allows the transmission signal to be inputted through the first terminal, and outputted to the second terminal through the first switching element. During reception, the first switching element becomes non-conductive, while the second switching element becomes conductive. This allows the reception signal received by the antenna to be inputted through the second terminal, and outputted to the third terminal through the second switching element.

A wireless communication apparatus according to an embodiment of the disclosure includes an antenna, and an antenna switch circuit that performs switching between input of a transmission signal to the antenna and output of a reception signal received by the antenna. The antenna switch circuit includes a first terminal, a second terminal, a third terminal, a first switching element, and a second switching element. The first terminal is supplied with the transmission signal. The second terminal is coupled to the antenna. The third terminal outputs the reception signal received by the antenna. The first switching element is coupled between the first terminal and the second terminal. The second switching element is coupled between the second terminal and the third terminal. The first switching element becomes conductive while the second switching element becomes non-conductive during transmission. The first switching element becomes non-conductive while the second switching element becomes conductive during reception. One or both of the first switching element and the second switching element includes the following components (A) to (D).

(A) a drain electrode and a source electrode that have a planar shape of combs in mesh with each other (B) a gate electrode that is provided between the drain electrode and the source electrode, and has a meandering planar shape (C) one or more gate-electrode extensions that are projected from the gate electrode (D) a link that is confronted with one or both of the drain electrode and the source electrode, and couples the one or more gate-electrode extensions together In the wireless communication apparatus according to the embodiment of the disclosure, the switching is performed by the antenna switch circuit, between the input of the transmission signal to the antenna and the output of the reception signal received by the antenna.

According to the semiconductor device of the embodiment of the disclosure, the one or more gate-electrode extensions are projected from the gate electrode. The one or more gate-electrode extensions are coupled together by the link. Hence, it is possible to suppress the increase in the resistance component and the inductance component generated in the gate electrode when the additional capacitor is coupled to the gate electrode.

According to the antenna switch circuit of the embodiment of the disclosure, or the wireless communication apparatus of the embodiment of the disclosure, one or both of the first switching element and the second switching element includes the semiconductor device according to the embodiment of the disclosure. This allows for the suppression of the increase in the resistance component and the inductance component generated in the gate electrodes when the additional capacitors are coupled to the gate electrodes of the first switching element and the second switching element. Hence, it is possible to stabilize circuit operation, leading to enhancement in an inputted electric power resistance characteristic and a harmonic distortion characteristic.

It is to be noted that some effects described here are not necessarily limitative, and any of other effects described herein may be achieved.

DESCRIPTION OF EMBODIMENTS

In the following, some embodiments of the disclosure are described in detail with reference to the drawings. Note that description is made in the following order.

1. First Embodiment (a multi-gate structure; an example in which a plurality of gate-electrode extensions are coupled together by a link)
2. Modification Example of First Embodiment (the multi-gate structure; an example in which a gate-electrode lead-around gate electrode is provided between a link on source-electrode side and a part near a gate resistor of a gate electrode)
3. Reference Example 1 (an example in which the plurality of gate-electrode extensions are provided separately, without being coupled together by the link)
4. Second Embodiment (the multi-gate structure; an example in which a drain electrode and a source electrode each include a widened part)
5. Modification Example of Second Embodiment (the multi-gate structure; an example in which the widened part overlaps the gate electrode in a horizontal plane)
6. Third Embodiment (the multi-gate structure; an example in which the gate-electrode extensions each are provided at an intersection of one of the comb-tooth parts and a long-side part of the drain electrode or the source electrode)
7. Fourth Embodiment (a single-gate structure: an example in which the gate-electrode extensions and the link are provided on drain-electrode side)
8. Modification Example of Fourth Embodiment (the single-gate structure: an example in which the gate-electrode extensions and the link are provided on the source-electrode side)
9. Application Example (antenna switch circuits and a wireless communication apparatus)

First Embodiment (An Example in which a Plurality of Gate-Electrode Extensions are Coupled Together by a Link)
<Configuration of First Embodiment>

Figure 1:
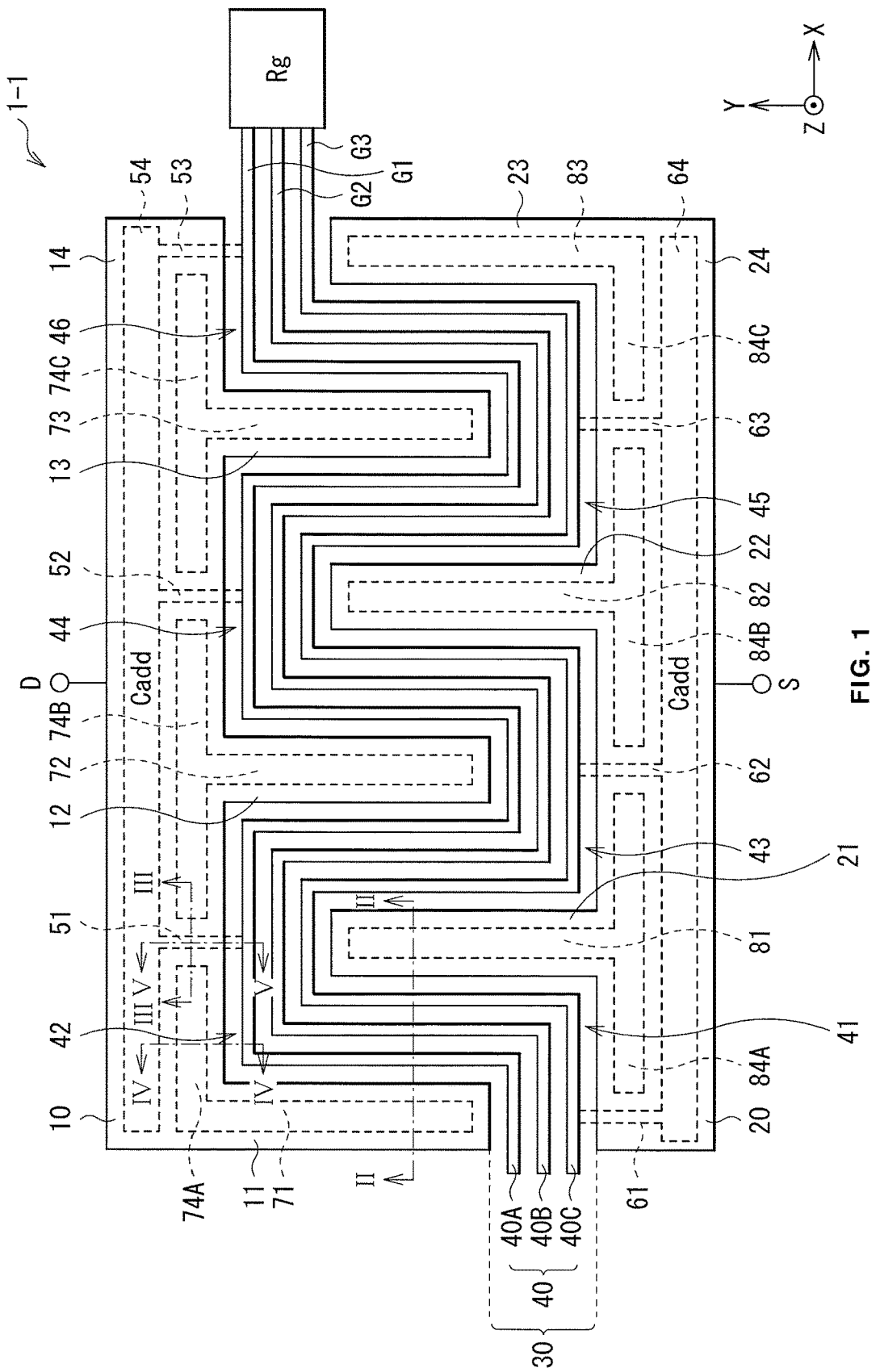
FIG. 1 is a plan view of a configuration of a semiconductor device according to a first embodiment of the disclosure.

FIG. 1 illustrates a plan configuration of a semiconductor device according to a first embodiment of the disclosure. A semiconductor device 1-1 may be, for example, a GaAs-based FET used as a switching element of an antenna switch circuit installed in a wireless communication apparatus such as a mobile terminal device. The semiconductor device 1-1 includes a drain electrode 10 and a source electrode 20, and a first gate electrode 40A, a second gate electrode 40B, and a third gate electrode 40C (hereinafter, collectively referred to as a gate electrode 40). The drain electrode 10 and the source electrode 20 have a planar shape of combs in mesh with each other. The gate electrode 40 may be provided in a gap 30 between the drain electrode 10 and the source electrode 20, and have a meandering planar shape. In other words, the semiconductor device 1-1 may have a multi-gate structure in which the gate electrode 40 may be provided in a plurality. This makes it possible to reduce area of an ohmic-contact electrode region, and to attain shrink of an FET size, as compared to a case with multistage-coupled FETs of a single-gate structure including the gate electrode 40 in a singularity. In this embodiment, description is given on an example of, for example, a triple-gate structure with the first to third gate electrodes 40A to 40C, but this is non-limiting. The number of the gate electrode 40 may be two (a dual-gate structure), or four or more, depending on a desired electric power resistance. Moreover, as described later, the number of the gate electrode 40 may be one (a single-gate structure).

In the following description and figures, X denotes a direction of a long side of the comb shape of the drain electrode 10 and the source electrode 20 (a left-right direction in FIG. 1). Y denotes a direction of a short side, or a comb tooth, of the comb shape of the drain electrode 10 and the source electrode 20 (an up-down direction in FIG. 1). Z denotes a direction of stacking (a direction orthogonal to a plane of the figure in FIG. 1).

The drain electrode 10 has the planar shape of the comb that may include a plurality of (for example, three, in FIG. 1) comb-tooth parts 11, 12, and 13, and a long-side part 14. The comb-tooth parts 11 to 13 may be provided on one side (on gate-electrode 40 side) of the long-side part 14. The comb-tooth parts 11 to 13 may be appropriately spaced apart, parallel to one another, and orthogonal to the long-side part 14. The long-side part 14 may be coupled to a drain terminal D.

The drain electrode 10 may include drain-electrode contacts 71, 72, 73, 74A, 74B, and 74C that may couple the drain electrode 10 to a semiconductor layer 100 which is described later. The drain-electrode contacts 71 to 73 may be provided on lower-layer side in a Z direction of the comb-tooth parts 11 to 13. The drain-electrode contacts 74A to 74C may be provided on the lower-layer side in the Z direction of the long-side part 14.

The source electrode 20 has the planar shape of the comb that may include a plurality of (for example, three, in FIG. 1) comb-tooth parts 21, 22, and 23, and a long-side part 24. The comb-tooth parts 21 to 23 may be provided on one side (on the gate-electrode 40 side) of the long-side part 24. The comb-tooth parts 21 to 23 may be appropriately spaced apart, parallel to one another, and orthogonal to the long-side part 24. The long-side part 24 may be coupled to a source terminal S.

The source electrode 20 may include source-electrode contacts 81, 82, 83, 84A, 84B, and 84C that may couple the source electrode 20 to the semiconductor layer 100 which is described later. The source-electrode contacts 81 to 83 may be provided on the lower-layer side in the Z direction of the comb-tooth parts 21 to 23. The source-electrode contacts 84A to 84C may be provided on the lower-layer side in the Z direction of the long-side part 24.

The drain electrode 10 and the source electrode 20 may be confronted with each other, with the comb-tooth parts 11 to 13 and the comb-tooth parts 21 to 23 in mesh with one another. The comb-tooth parts 11 to 13 of the drain electrode 10 and the comb-tooth parts 21 to 23 of the source electrode 20 may be arranged alternatively. This allows the gap 30 of a meandering shape to be formed between the comb-tooth parts 11 to 13 of the drain electrode 10 and the comb-tooth parts 21 to 23 of the source electrode 20.

The gate electrode 40, i.e., the first to third gate electrodes 40A to 40C here, may be arranged in the gap 30 at equal intervals (at equal pitches) or at substantially equal intervals. The gate electrode 40 has the meandering planar shape including a plurality of (for example, six, in FIG. 1) bends 41, 42, 43, 44, 45, and 46. The first gate electrode 40A may be coupled to a gate terminal G1. The second gate electrode 40B may be coupled to a gate terminal G2. The third gate electrode 40C may be coupled to a gate terminal G3. The gate terminals G1 to G3 may be coupled to a gate resistor Rg. A control voltage may be applied to the gate electrode 40 from outside through the gate resistor Rg. The control voltage may allow for control of conduction and non-conduction of the semiconductor device 1-1. It is to be noted that, in an antenna switch circuit which is described later, such application of the control voltage may allow for on/off operation as a radio frequency switch.

Figure 2:
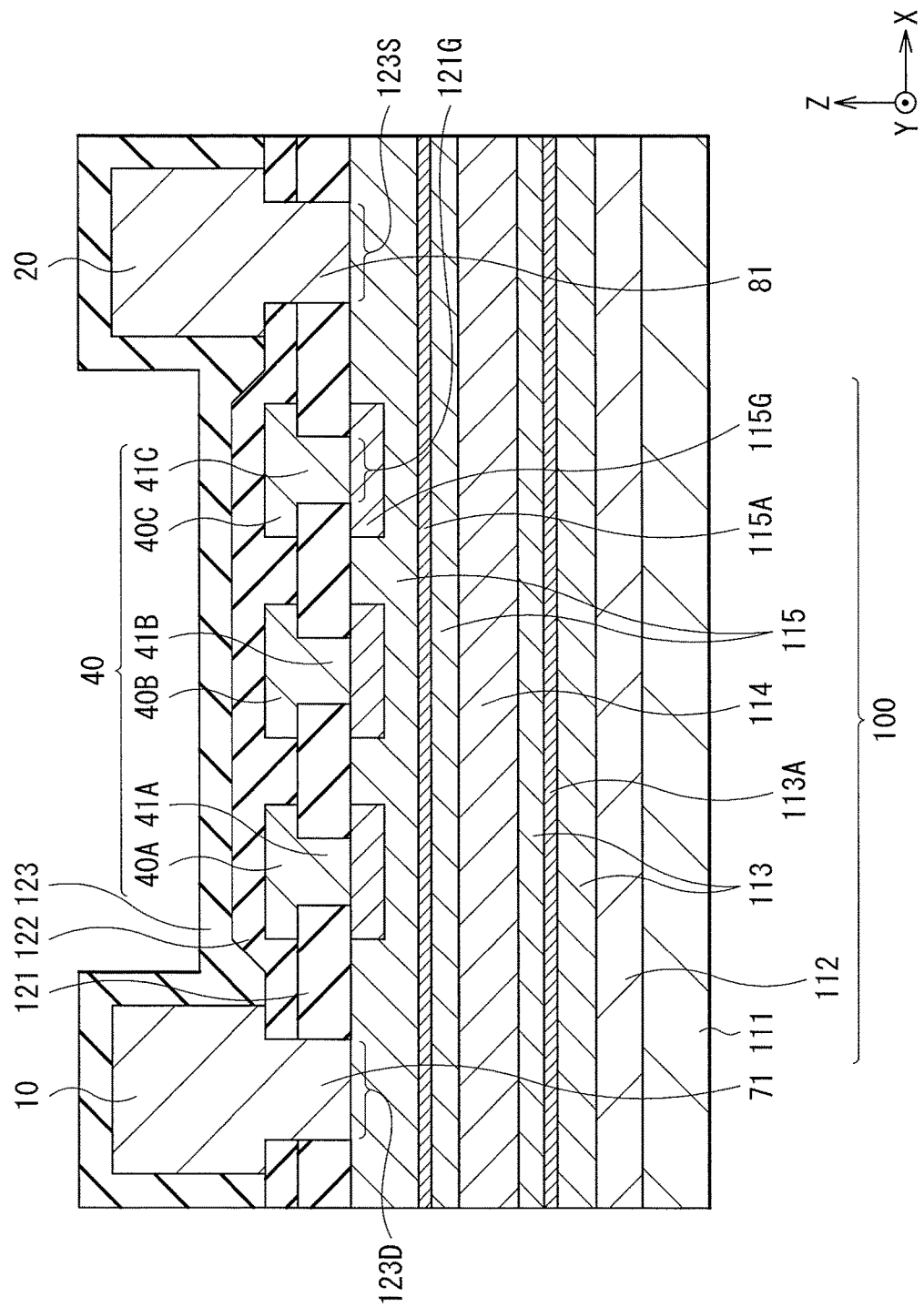
FIG. 2 is a cross-sectional view of the semiconductor device illustrated in FIG. 1, taken along a line II-II.

The first to third gate electrodes 40A, 40B, and 40C may be respectively provided with gate-electrode contacts 41A, 41B, and 41C (undepicted in FIG. 1, refer to FIG. 2). The gate-electrode contacts 41A, 41B, and 41C may establish coupling to the semiconductor layer 100 which is described later.

The semiconductor device 1-1 includes gate-electrode extensions 51, 52, 53, 61, 62, and 63, and links 54 and 64. The gate-electrode extensions 51 to 53 are projected toward the drain electrode 10 from the bends 42, 44, and 46 of the first gate electrode 40A. The gate-electrode extensions 61 to 63 are projected toward the source electrode 20 from the bends 41, 43, and 45 of the third gate electrode 40C. The link 54 is confronted with the drain electrode 10, and couples the gate-electrode extensions 51 to 53 together. The link 64 is confronted with the source electrode 20, and couples the gate-electrode extensions 61 to 63 together. Hence, in the semiconductor device 1-1, it is possible to suppress an increase in a resistance component and an inductance component generated in the first and third gate electrodes 40A and 40C when additional capacitors Cadd are coupled to the first and third gate electrodes 40A and 40C.

The link 54 may be provided on the lower-layer side of the long-side part 14 of the drain electrode 10, and may be confronted with the long-side part 14 of the drain electrode 10 in the Z direction. Accordingly, the link 54, the drain electrode 10, and an insulating layer 122 which is described later may constitute the additional capacitor Cadd on the drain-electrode 10 side. The link 54 may couple the gate-electrode extensions 51 to 53 together in a lengthwise direction (X direction) of the long-side part 14 of the drain electrode 10.

The link 64 may be provided on the lower-layer side of the long-side part 24 of the source electrode 20, and confronted with the long-side part 24 of the source electrode 20 in the Z direction. Accordingly, the link 64, the source electrode 20, and the insulating layer 122 which is described later may constitute the additional capacitor Cadd on the source-electrode 20 side. The link 64 may couple the gate-electrode extensions 61 to 63 together in the lengthwise direction (X direction) of the long-side part 24 of the source electrode 20.

Thus, the additional capacitors Cadd may be coupled to the first and third gate electrodes 40A and 40C. This makes it possible to enhance an electric power resistance characteristic upon input of a signal of large electric power (large amplitude), and to stabilize circuit operation. Changing sizes of the link 54 and 64, mainly a dimension in the Y direction illustrated in FIG. 1, makes it possible to adjust magnitude of the additional capacitors Cadd appropriately.

The gate-electrode extensions 51 to 53, and 61 to 63 may be provided, for example, at positions confronted with tips or center parts of the bends 41 to 46 of the first and third gate electrodes 40A and 40C. The gate-electrode extensions 51 to 53, and 61 to 63 may be provided in crossing relation to the long-side parts 14 and 24 of the drain electrode 10 and the source electrode 20.

The gate-electrode extension 51 may couple the bend 42 of the first gate electrode 40A to the link 54. The gate-electrode extension 52 may couple the bend 44 of the first gate electrode 40A to the link 54. The gate-electrode extension 53 may couple the bend 46 of the first gate electrode 40A to the link 54. There is no particular limitation on planar shapes of the gate-electrode extensions 51 to 53. For example, the gate-electrode extensions 51 to 53 may be of a linear shape (l-shape) between the first gate electrode 40A and the link 54.

The gate-electrode extension 61 may couple the bend 41 of the third gate electrode 40C to the link 64. The gate-electrode extension 62 may couple the bend 43 of the third gate electrode 40C to the link 64. The gate-electrode extension 63 may couple the bend 45 of the third gate electrode 40C to the link 64. There is no particular limitation on planar shapes of the gate-electrode extensions 61 to 63. For example, the gate-electrode extensions 61 to 63 may be of the linear shape (l-shape) between the third gate electrode 40C and the link 64.

Here, in one preferred example, the drain-electrode contacts 74A to 74C and the source-electrode contacts 84A to 84C may be arranged to avoid overlap with the gate-electrode extensions 51 to 53, and 61 to 63 in a horizontal plane. This makes it possible, as described later, to reduce a flow-around of a current component, to shorten current paths, and to avoid the increase in the resistance component.

Moreover, in one preferred example, widths in the X direction of the gate-electrode extensions 51 to 53, and 61 to 63 may be small. This makes it possible to reduce a distance in the X direction between the drain-electrode contacts 74A and 74B, a distance in the X direction between the drain-electrode contacts 74B and 74C, a distance in the X direction between the source-electrode contacts 84A and 84B, and a distance in the X direction between the source-electrode contacts 84B and 84C. Hence, it is possible to avoid the flow-around of the current component, and to reduce the resistance component. It is to be noted that, in one preferred example, the widths in the X direction of the gate-electrode extensions 51 to 53, and 61 to 63 may be constant in the Y direction, in view of reduction in resistance. When the inductance component is negligible, however, the widths in the X direction of the gate-electrode extensions 51 to 53, and 61 to 63 may be varied in the Y direction.

Figure 3:
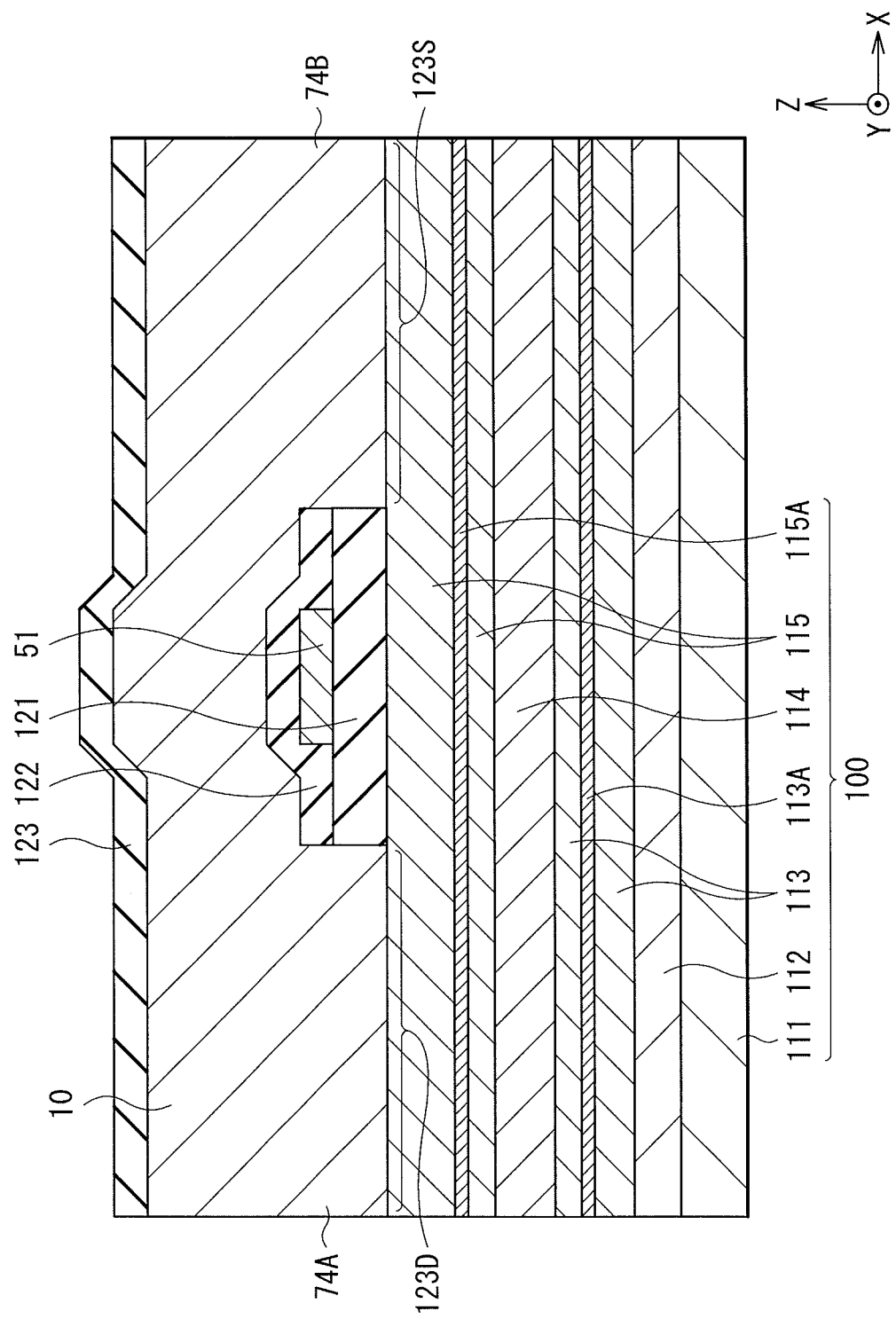
FIG. 3 is a cross-sectional view of the semiconductor device illustrated in FIG. 1, taken along a line III-III.
Figure 4:
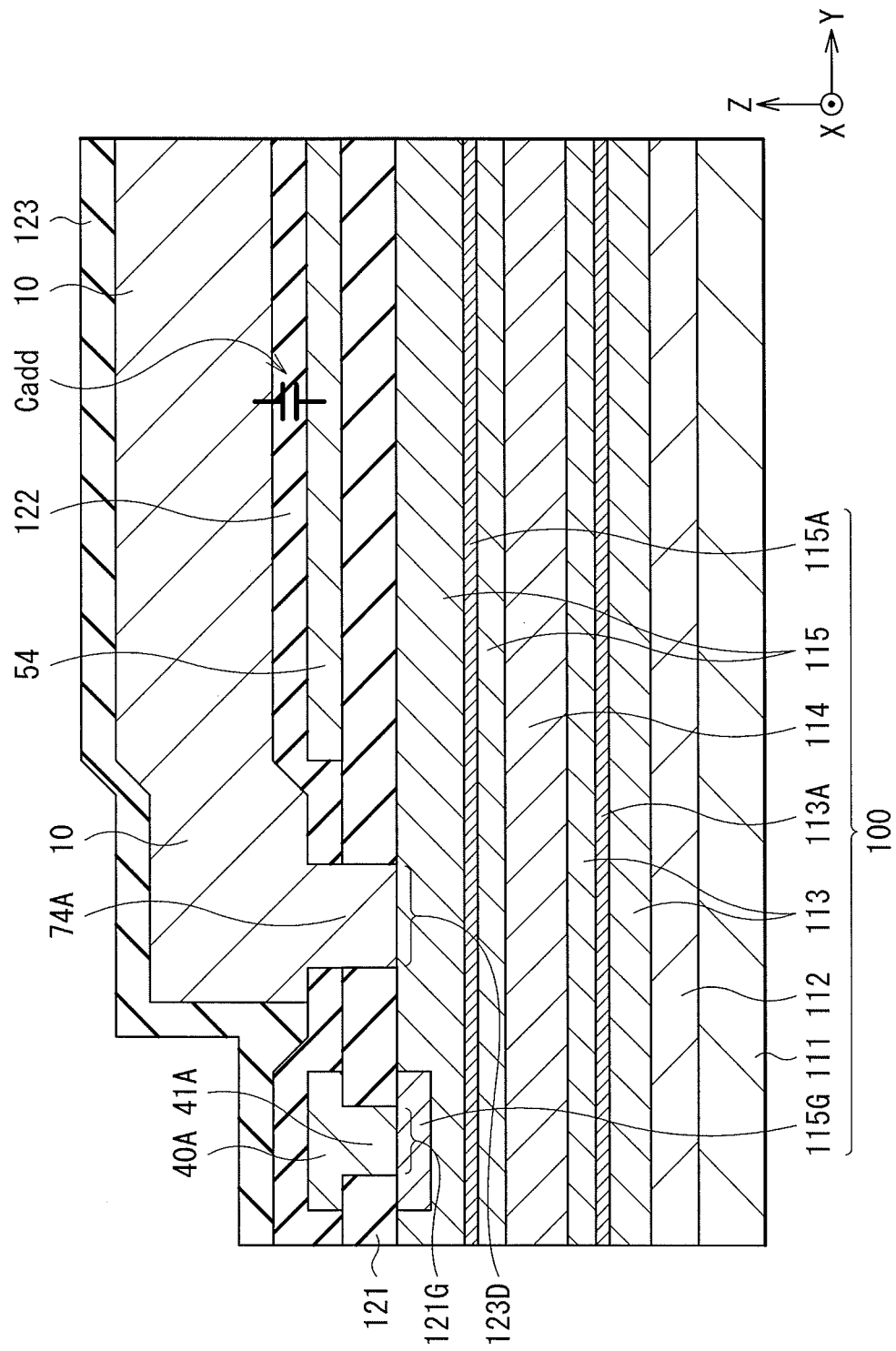
FIG. 4 is a cross-sectional view of the semiconductor device illustrated in FIG. 1, taken along a line IV-IV.
Figure 5:
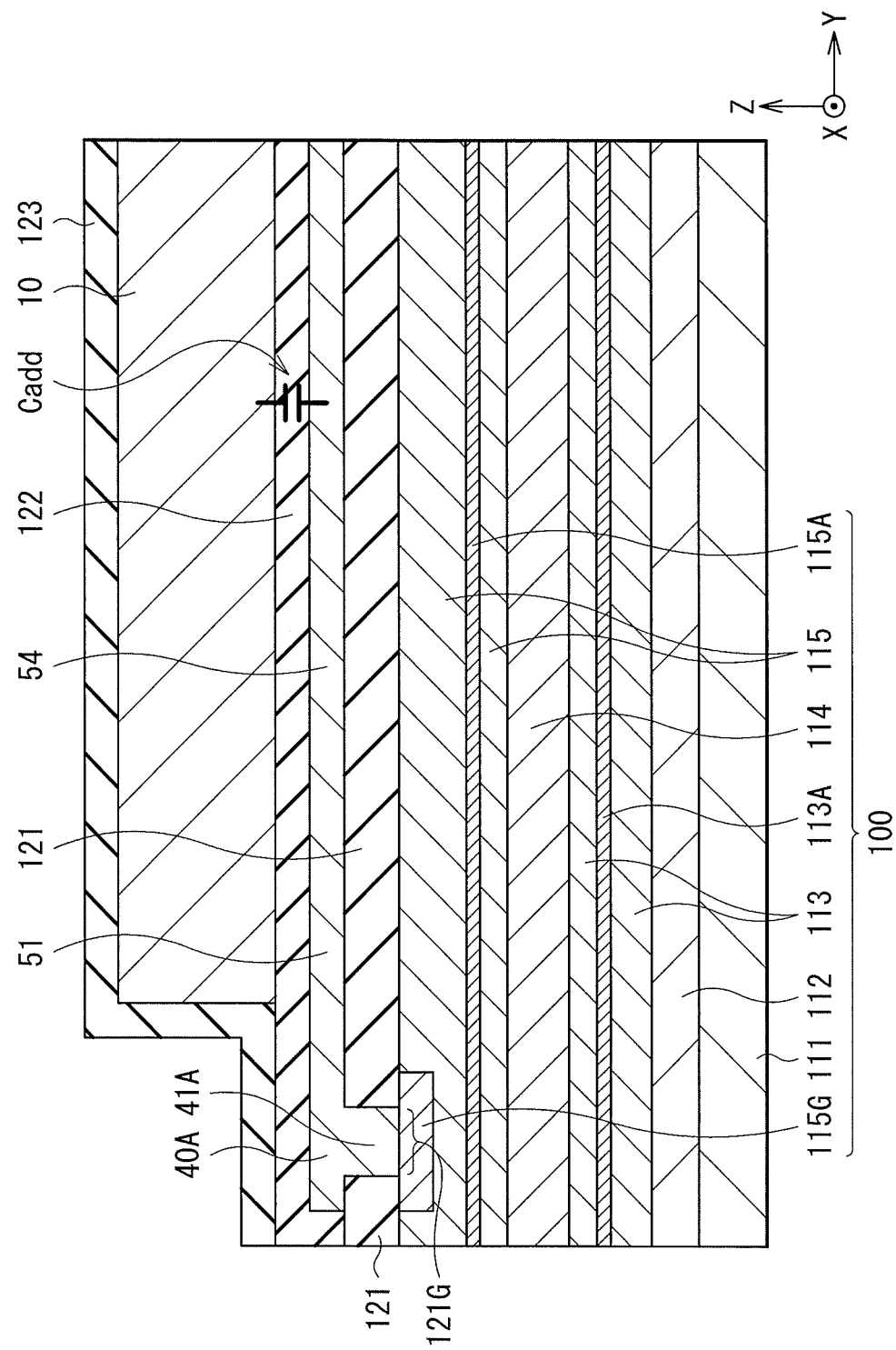
FIG. 5 is a cross-sectional view of the semiconductor device illustrated in FIG. 1, taken along a line V-V.

FIG. 2 illustrates a cross-sectional configuration, taken along an X-Z plane denoted by a line II-II, of the semiconductor device 1-1 illustrated in FIG. 1. FIG. 3 illustrates a cross-sectional configuration taken along an X-Z plane that is denoted by a line III-III and is different from that of FIG. 2 in a position in the Y direction. FIG. 4 illustrates a cross-sectional configuration, taken along a Y-Z plane denoted by a line IV-IV, of the semiconductor device 1-1 illustrated in FIG. 1. FIG. 5 illustrates a cross-sectional configuration taken along a Y-Z plane that is denoted by a line V-V and is different from that of FIG. 4 in a position in the X direction.

The drain electrode 10, the source electrode 20, and the gate electrode 40 may be provided on the semiconductor layer 100. The insulating layers 121 and 122 may be provided between the semiconductor layer 100 and the drain electrode 10 or the source electrode 20. The insulating layer 121 may be provided between the semiconductor layer 100 and the gate electrode 40. Surfaces of the drain electrode 10, the source electrode 20, and the insulating layer 122 may be covered with an insulating layer 123.

The drain electrode 10 may be provided on the insulating layers 121 and 122, and may be coupled to the semiconductor layer 100 by the drain-electrode contacts 71 to 73, and 74A to 74C (refer to FIG. 1). The drain-electrode contacts 71 to 73, and 74A to 74C may be provided inside contact holes 123D provided in the insulating layers 121 and 122.

The source electrode 20 may be provided on the insulating layers 121 and 122, and may be coupled to the semiconductor layer 100 by the source-electrode contacts 81 to 83, and 84A to 84C (refer to FIG. 1). The source-electrode contacts 81 to 83, and 84A to 84C may be provided inside contact holes 123S provided in the insulating layers 121 and 122.

The gate electrode 40 may be provided on the insulating layer 121, and may be coupled to the semiconductor layer 100 by the gate-electrode contacts 41A, 41B, and 41C. The gate-electrode contacts 41A to 41C may be provided inside contact holes 121G provided in the insulating layer 121.

The semiconductor layer 100 may have a configuration in which, for example, a buffer layer 112, a lower barrier layer 113, a channel layer 114, and an upper barrier layer 115 may be stacked in the order named, on a substrate 111. The substrate 111 may be made of III-V group compound semiconductor. The buffer layer 112, the lower barrier layer 113, the channel layer 114, and the upper barrier layer 115 each may be made of a compound semiconductor material. A carrier supply region 113A may be provided inside the lower barrier layer 113. A carrier supply region 115A may be provided inside the upper barrier layer 115. Low-resistance regions 115G may be provided on surface side of the upper barrier layer 115. In other words, the semiconductor device 1-1 may be, for example, a so-called JPHEMT (Junction Pseudo-morphic High Electron Mobility Transistor) in which the upper barrier layer 115 may be provided between the gate electrode 40 and the channel layer 114, and the low-resistance regions 115G of an opposite conductive type may be provided inside the upper barrier layer 115.

The substrate 111 may be made of, for example, a semi-insulating single-crystal GaAs substrate, or an InP substrate. The buffer layer 112 may be made of, for example, non-doped GaAs. The lower barrier layer 113 may be made of, for example, $Al_{0.2}Ga_{0.8}As$ mixed crystal. The carrier supply region 113A inside the lower barrier layer 113 may be made of, for example, $Al_{0.2}Ga_{0.8}.As$ mixed crystal doped with silicon (Si) as an n-type impurity. A region other than the carrier supply region 113A of the lower barrier layer 113 may be non-doped, or doped with the n-type impurity or a p-type impurity at a low concentration. The channel layer 114 may be made of, for example, $In_{0.2}Ga_{0.8}As$ mixed crystal. The upper barrier layer 115 may be made of, for example. $Al_{0.2}Ga_{0.8}As$ mixed crystal. The carrier supply region 115A inside the upper barrier layer 115 may be made of, for example. $Al_{0.2}Ga_{0.8}As$ mixed crystal doped with silicon (Si) as the n-type impurity. A region other than the carrier supply region 115A of the upper barrier layer 115 may be non-doped, or doped with the n-type impurity or the p-type impurity at a low concentration. The low-resistance regions 115G may include an impurity of the opposite conductive type to that of a carrier traveling through the channel layer 114. For example, when the carrier is an electron, the low-resistance region 115G may include the p-type impurity.

(Equivalent Circuit)

Figure 6:
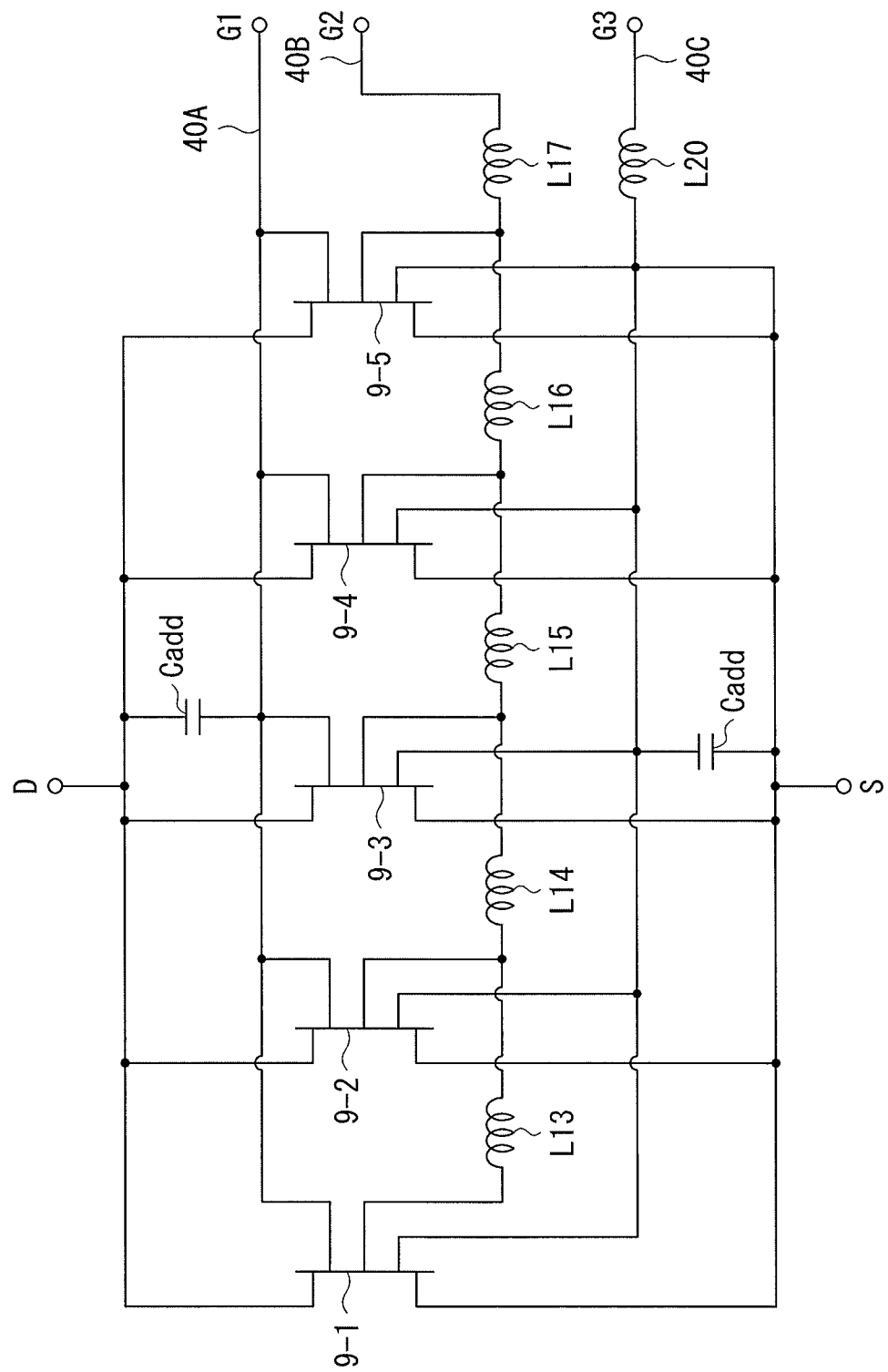
FIG. 6 is a diagram of an equivalent circuit of the semiconductor device illustrated in FIG. 1.

FIG. 6 illustrates an equivalent circuit of the semiconductor device 1-1. The semiconductor device 1-1 may be considered to be equivalent to five parallel-coupled field effect transistors (conveniently referred to as a first equivalent field effect transistor 9-1, a second equivalent field effect transistor 9-2, a third equivalent field effect transistor 9-3, a fourth equivalent field effect transistor 9-4, and a fifth equivalent field effect transistor 9-5).

The first equivalent field effect transistor 9-1 may be an equivalent field effect transistor that may be considered to be formed by the comb-tooth part 11 of the drain electrode 10, the comb-tooth part 21 of the source electrode 20, and the first to third gate electrodes 40A to 40C. The second equivalent field effect transistor 9-2 may be an equivalent field effect transistor that may be considered to be formed by the comb-tooth part 12 of the drain electrode 10, the comb-tooth part 21 of the source electrode 20, and the first to third gate electrode 40A to 40C. The third equivalent field effect transistor 9-3 may be an equivalent field effect transistor that may be considered to be formed by the comb-tooth part 12 of the drain electrode 10, the comb-tooth part 22 of the source electrode 20, and the first to third gate electrodes 40A to 40C. The fourth equivalent field effect transistor 9-4 may be an equivalent field effect transistor that may be considered to be formed by the comb-tooth part 13 of the drain electrode 10, the comb-tooth part 22 of the source electrode 20, and the first to third gate electrodes 40A to 40C. The fifth equivalent field effect transistor 9-5 may be an equivalent field effect transistor that may be considered to be formed by the comb-tooth part 13 of the drain electrode 10, the comb-tooth part 23 of the source electrode 20, and the first to third gate electrodes 40A to 40C.

The second gate electrode 40B of the first to fifth equivalent field effect transistors 9-1 to 9-5 may have an equivalent circuit in which inductance components L13 to L17 may be generated in accordance with the respective equivalent field effect transistors 9-1 to 9-5. In the third gate electrode 40C, an inductance component L20 may be generated in vicinity of the gate terminal G3.

Figure 7:
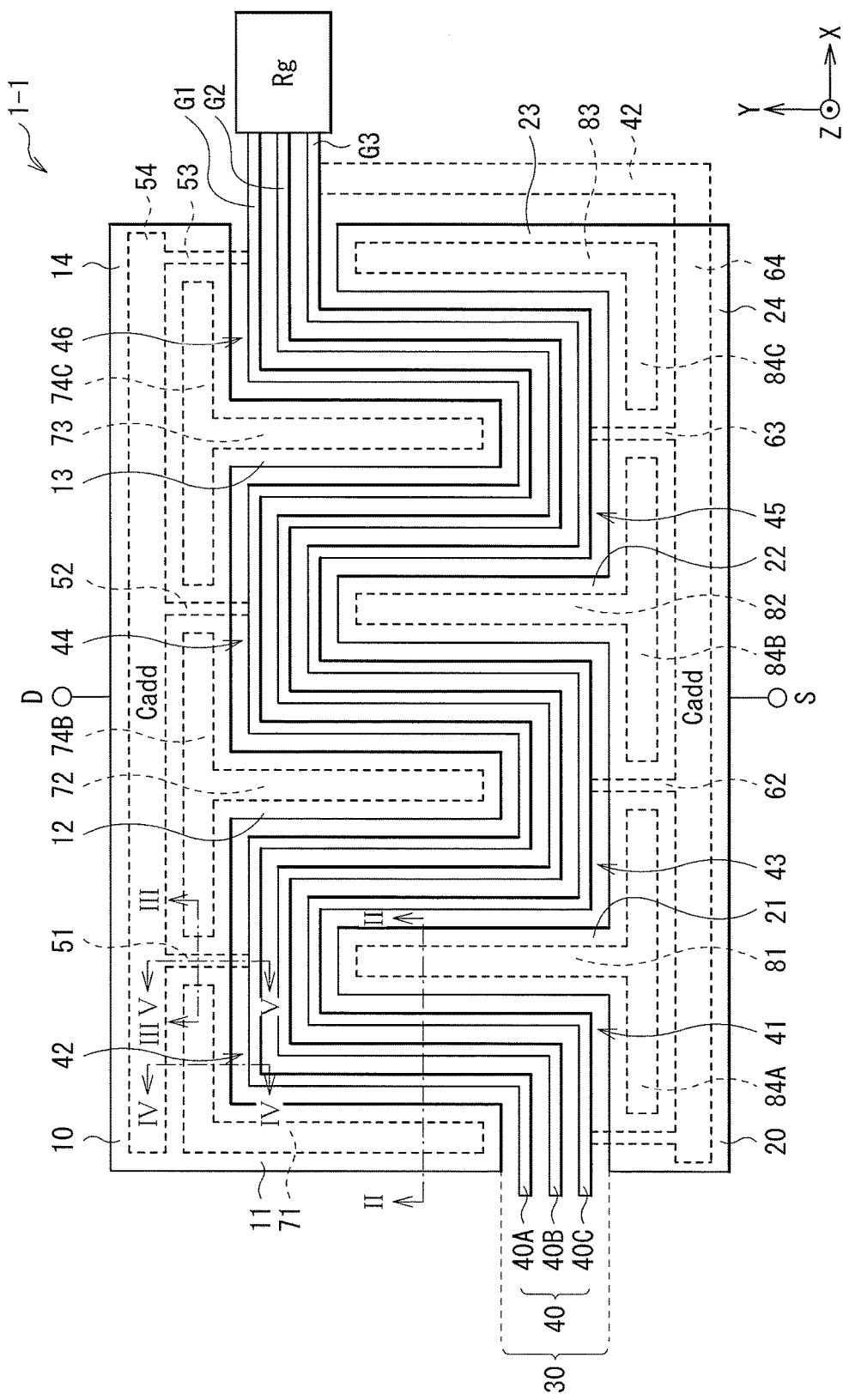
FIG. 7 is a plan view of a modification example of the semiconductor device illustrated in FIG. 1.

In one preferred example, therefore, as illustrated in FIG. 7, for example, a lead-around gate electrode 42 may be provided. The lead-around gate electrode 42 may couple the link 64 of the additional capacitor Cadd on the source-electrode 20 side to a part near the gate resistor Rg of the third gate electrode 40C. This makes it possible to reduce the inductance component L20 illustrated in FIG. 6 to a very small value. In one preferred example, the lead-around gate electrode 42 may have a wiring width that allows the inductance component and an impedance component to be negligible.

Reference Example 1

Figure 8:
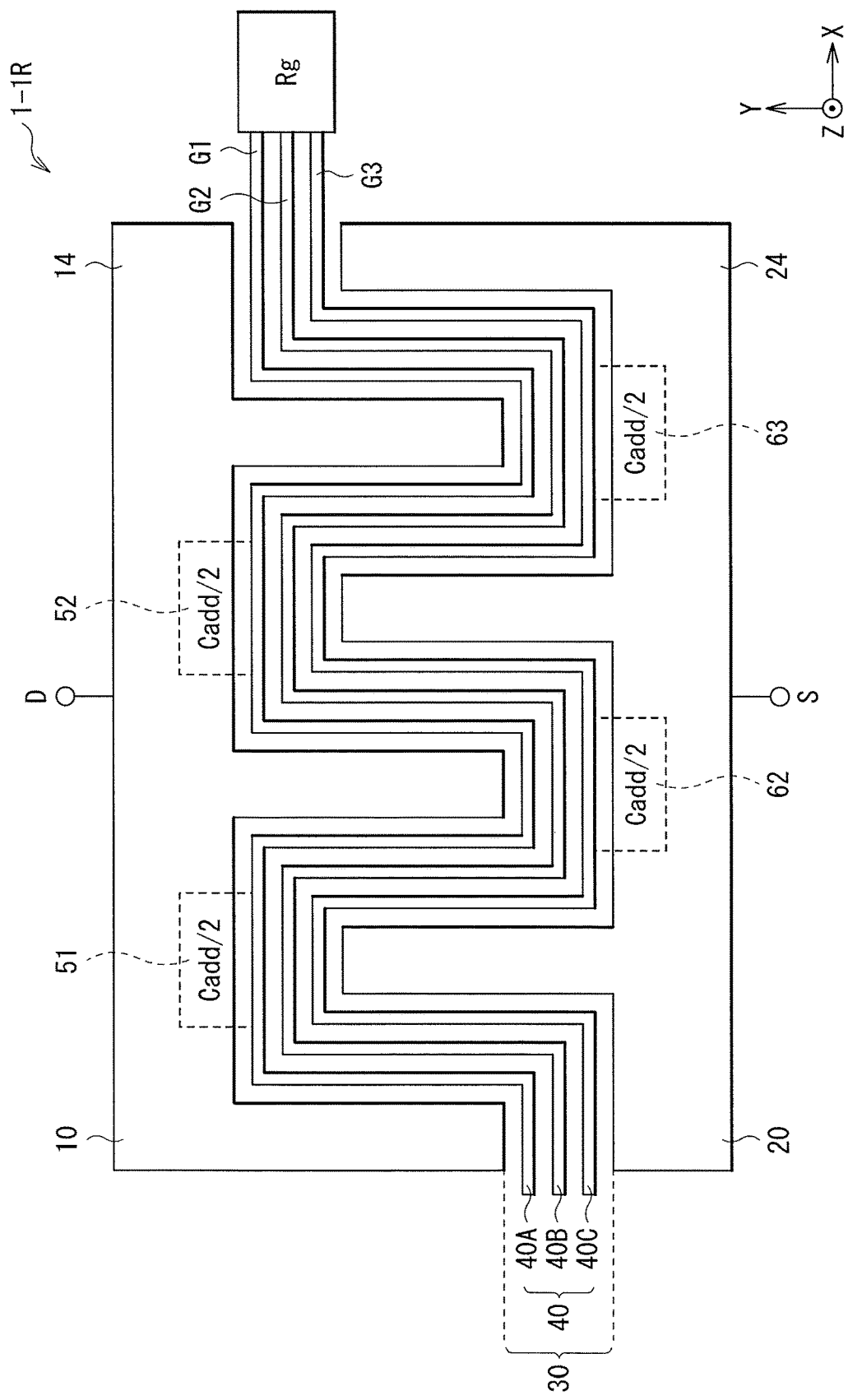
FIG. 8 is a plan view of a configuration of a semiconductor device according to a reference example 1.

FIG. 8 illustrates a plan configuration of a semiconductor device 1-1R according to a reference example 1. In the reference example 1, the plurality of gate-electrode extensions 51, 52, 62, and 63 may be provided in an isolated arrangement from one another, without being coupled together by the links 54 and 64. In the reference example 1, an additional capacitor Cadd/2 on the drain-electrode 10 side may be formed between the gate-electrode extension 51 and the long-side part 14 of the drain electrode 10. The additional capacitor Cadd/2 on the drain-electrode 10 side may be formed between the gate-electrode extension 52 and the long-side part 14 of the drain electrode 10. The additional capacitor Cadd/2 on the source-electrode 20 side may be formed between the gate-electrode extension 62 and the long-side part 24 of the source electrode 20. The additional capacitor Cadd/2 on the source-electrode 20 side may be formed between the gate-electrode extension 63 and the long-side part 24 of the source electrode 20.

Figure 9:
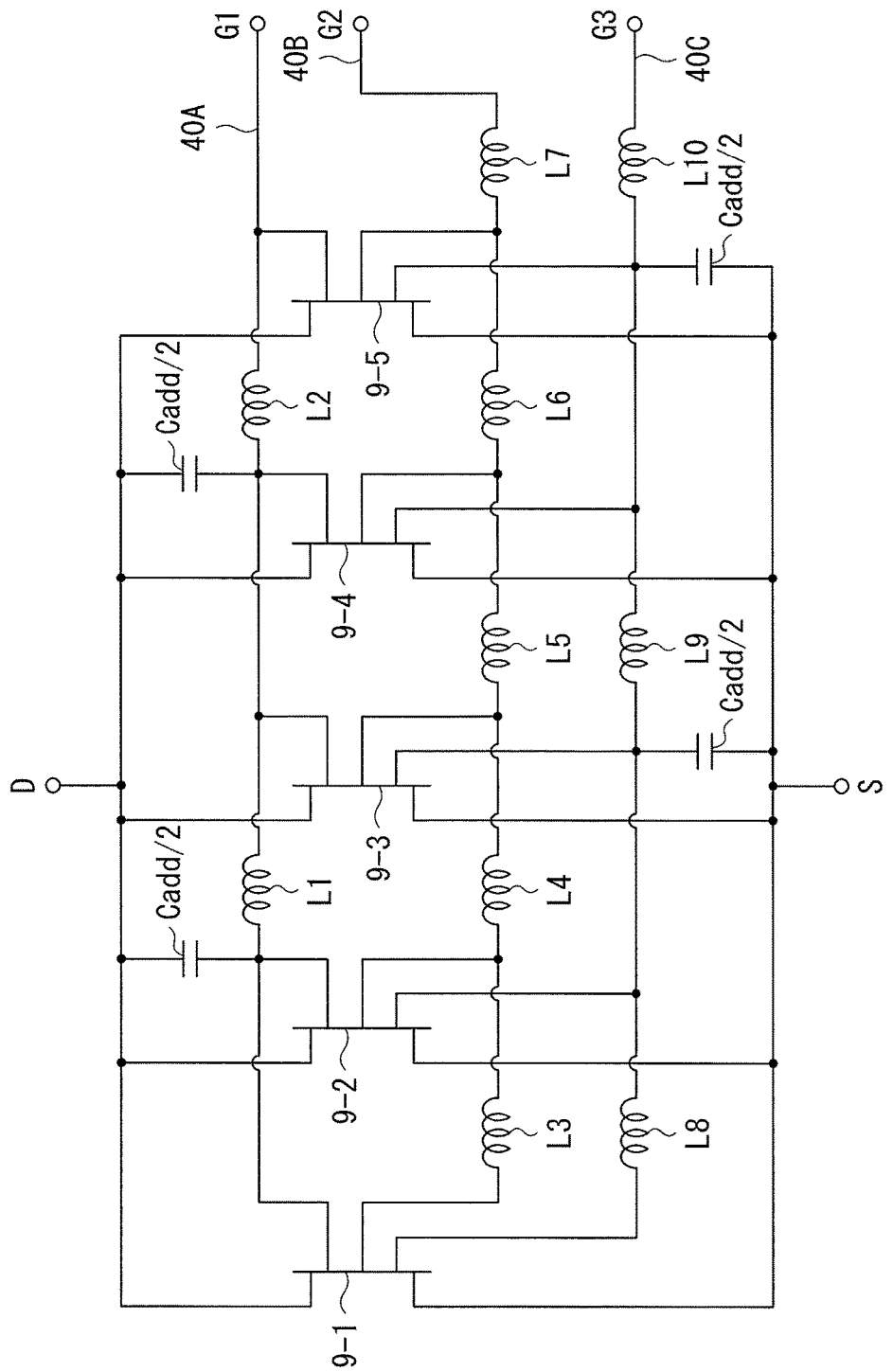
FIG. 9 is a diagram of an equivalent circuit of the semiconductor device illustrated in FIG. 8.

FIG. 9 illustrates an equivalent circuit of the semiconductor device 1-1R according to the reference example 1. In the reference example 1, inductance components L8, L9, and L10 may be generated with respect to the additional capacitors Cadd/2 on the source-electrode 20 side. Inductance components L1 and L2 may be generated with respect to the additional capacitors Cadd/2 on the drain-electrode 10 side. In addition, although not illustrated in the equivalent circuit, impedance components may be generated as well in a similar manner. Being affected by these, effects of the additional capacitors Cadd/2 may be impaired. This causes inconvenience such as deterioration in an inputted electric power resistance characteristic and deterioration in a harmonic distortion characteristic.

In addition, although not illustrated in FIG. 8, contacts may be formed between the drain electrode 10 and the semiconductor layer 100, or between the source electrode 20 and the semiconductor layer 100, for their electrical coupling. The contacts may electrically couple the drain electrode 10 (or the source electrode 20) to the semiconductor layer 100. When the contacts overlap the gate electrode 40 in a horizontal plane, they may be electrically coupled together. Thus, the contacts and the gate electrodes 40 may be spaced apart.

Figure 10:
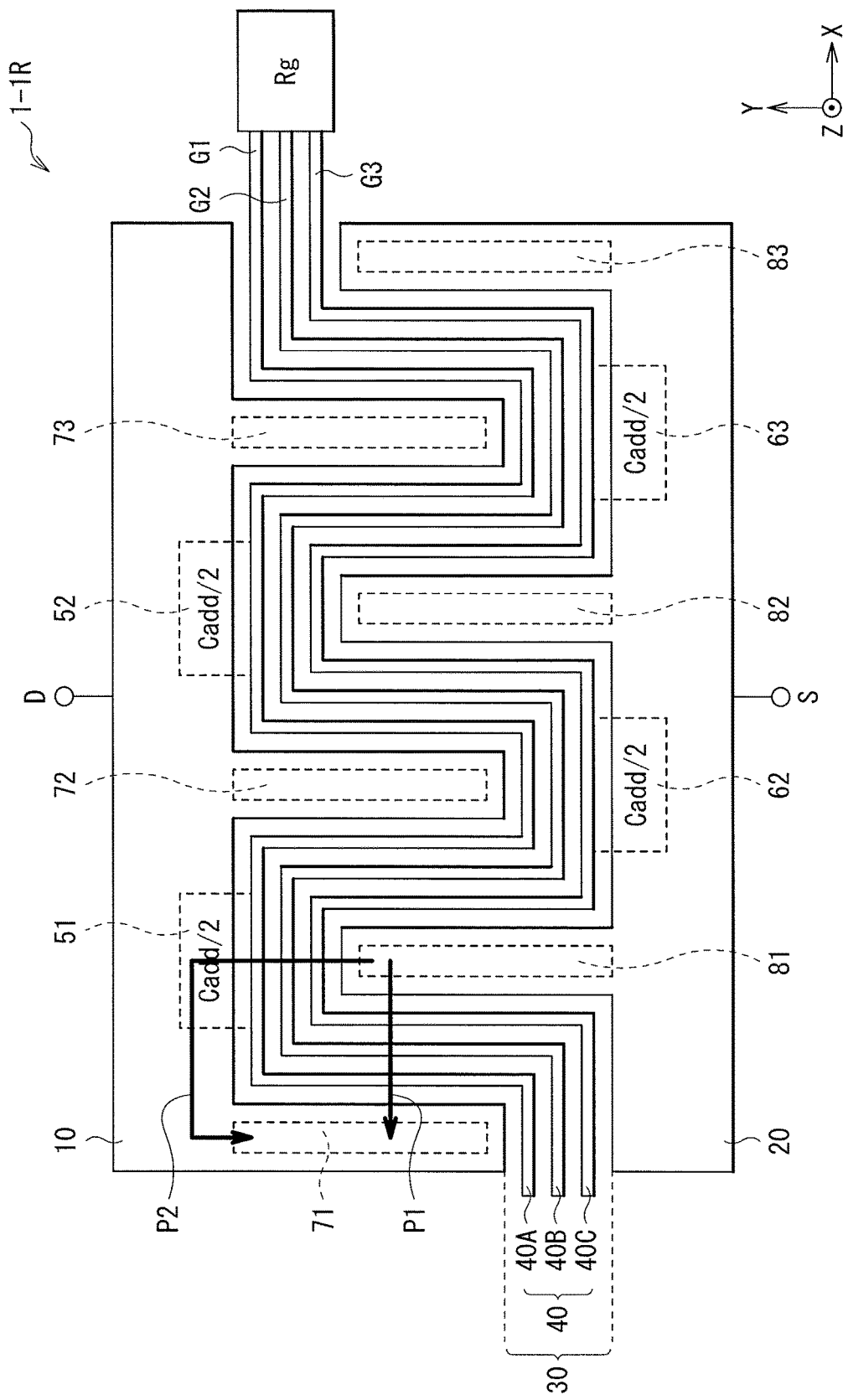
FIG. 10 is a plan view of an example of arrangement of contacts in the semiconductor device illustrated in FIG. 8.

For example, as illustrated in FIG. 10, assume that the contacts 71 to 73, and 81 to 83 are provided, for example, solely in the Y direction. In this case, for example, a current component flowing in the X direction from the contact 81 of the source electrode 20 may be directly extracted to the drain electrode 10 from the contact 71 (a current path P1). In contrast, a current component flowing in the Y direction from the contact 81 may be flow around the contact 71 (a current path P2). This causes inconvenience of the increase in the resistance component.

Figure 11:
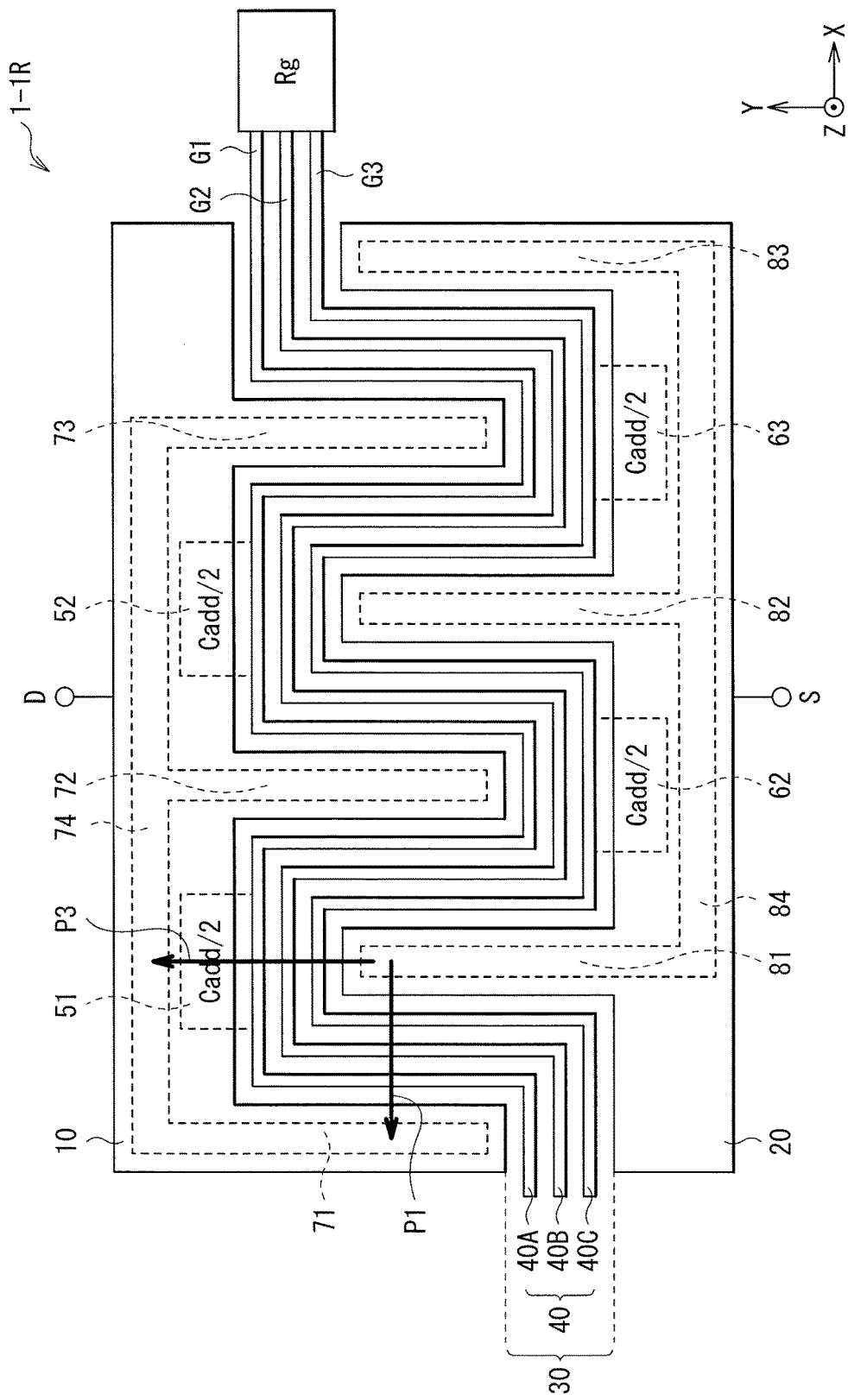
FIG. 11 is a plan view of another example of the arrangement of the contacts in the semiconductor device illustrated in FIG. 8.

In one alternative, as illustrated in FIG. 11, there may be possibility that, for example, contacts 74 and 84 may be provided outside the additional capacitors Cadd/2 as well. In this case, for example, when a current flows into the contact 74 of the drain electrode 10 from the contact 81 of the source electrode 20 (a current path P3), the increase in the resistance component may be more suppressed in the case of the current path P2. However, the resistance component may be larger, as compared to the case of the current path P1. Moreover, the additional capacitors Cadd/2 may become larger in size. Accordingly, when the contacts 74 and 84 are located apart from the gate electrode 40, a current may flow through the current path P2. This leads to the increase in the resistance component.

Furthermore, in both cases of FIGS. 10 and 11, it is desirable to increase amounts of projection of the gate-electrode extensions 51, 52, 62, and 63, in order to enlarge the additional capacitors Cadd/2. This results in difficulty in reducing the FET size including the additional capacitors Cadd/2.

(Comparison of Embodiment with Reference Example 1)

In the embodiment, as appreciated from the equivalent circuit illustrated in FIG. 6, the inductance components L8 and L9, and the inductance components L1 and L2 may be eliminated. The inductance components L8 and L9 may be generated in the third gate electrode 40C in the reference example 1. The inductance components L1 and L2 may be generated in the first gate electrode 40A in the reference example 1. Thus, the increase in the resistance component and the inductance component may be suppressed. The resistance component and the inductance component may be generated in the first and third gate electrodes 40A and 40C when the additional capacitors Cadd are coupled to the first and third gate electrodes 40A and 40C.

Moreover, in the embodiment, as appreciated from the plan view illustrated in FIG. 1, the drain-electrode extensions 74A to 74C, and 84A to 84C may be arranged to avoid the overlap with the gate-electrode extensions 51 to 53, and 61 to 63 in the horizontal plane. Accordingly, in the long-side part 14 of the drain electrode 10, the drain-electrode contacts 74A to 74C may be disposed closer to the gate electrode 40 than the link 54 is. In the long-side part 24 of the source electrode 20, the source-electrode contacts 84A to 84C may be disposed closer to the gate electrode 40 than the link 64 is. Thus, current paths in the Y direction from the source-electrode contacts 81 to 83 to the drain-electrode contacts 74A to 74C may be shortened, leading to the reduction in the resistance components.

<Manufacturing Method of First Embodiment>

The semiconductor device 1-1 may be manufactured, for example, as follows.

First, the buffer layer 112, the lower barrier layer 113, the channel layer 114, and the upper barrier layer 115 may be sequentially formed by epitaxial growth, on the substrate 111. The buffer layer 112, the lower barrier layer 113, the channel layer 114, and the upper barrier layer 115 each may be made of the compound semiconductor material. Thus, the semiconductor layer 100 may be formed (refer to FIGS. 2 to 5).

Next, the insulating layer 121 having the contact holes 121G may be formed on the semiconductor layer 100. The p-type impurity may be introduced through the contact holes 121G to form the low-resistance regions 115G. The first to third gate electrodes 40A to 40C may be formed on the insulating layer 121, while the gate-electrode contacts 41A to 41C may be formed inside the contact holes 121G (refer to FIG. 2).

At this occasion, the gate-electrode extensions 51 to 53 may be projected from the bends 42, 44, and 46 of the first gate electrode 40A, while the gate-electrode extensions 51 to 53 may be coupled together by the link 54 (refer to FIGS. 1 and 5). Meanwhile, the gate-electrode extensions 61 to 63 may be projected from the bends 41, 43, and 45 of the third gate electrode 40C, while the gate-electrode extensions 61 to 63 may be coupled together by the link 64 (refer to FIG. 1).

Thereafter, the insulating layer 122 may be formed on the insulating layer 121, the first to third gate electrodes 40A to 40C, the gate-electrode extensions 51 to 53, and 61 to 63. The contact holes 123D and 123S may be formed in the insulating layers 121 and 122 (refer to FIGS. 2 to 4). It is to be noted that, although not illustrated, electrode layers may be formed in advance that are in ohmic contact with a region where the contact holes 123D and 123S are formed. This allows for reduction in contact resistance.

Thereafter, the drain electrode 10 may be formed on the insulating layer 122, while the drain-electrode contacts 71 to 73, and 74A to 74C may be formed inside the contact holes 123D (refer to FIGS. 1, 2, and 4). Also, the source electrode 20 may be formed on the insulating layer 122, while the source-electrode contacts 81 to 83, and 84A to 84C may be formed inside the contact holes 123S (refer to FIG. 1). Thus, the additional capacitor Cadd on the drain-electrode 10 side may be formed by the drain electrode 10, the link 54, and the insulating layer 122 (refer to FIGS. 1, 4, and 5), while the additional capacitor Cadd on the source-electrode 20 side may be formed by the source electrode 20, the link 64, and the insulating layer 122 (refer to FIG. 1).

Thereafter, the insulating layer 123 may be formed on the surfaces of the drain electrode 10, the source electrode 20, and the insulating layer 122 (refer to FIGS. 2 to 5). Thus, the semiconductor device 1-1 illustrated in FIGS. 1 to 5 may be completed.

<Workings of First Embodiment>

In the semiconductor device 1-1, the plurality of gate-electrode extensions 51 to 53 may be projected from the first gate electrode 40A. The plurality of gate-electrode extensions 51 to 53 may be coupled together by the link 54 in the direction of the long side of the comb shape of the drain electrode 10. The link 54 may be confronted with the long side of the comb shape of the drain electrode 10. The additional capacitor Cadd may be formed between the link 54 and the drain electrode 10.

Similarly, the plurality of gate-electrode extensions 61 to 63 may be projected from the third gate electrode 40C. The plurality of gate-electrode extensions 61 to 63 may be coupled together by the link 64 in the direction of the long side of the comb shape of the source electrode 20. The link 64 may be confronted with the long side of the comb shape of the source electrode 20. The additional capacitor Cadd may be formed between the link 64 and the source electrode 20.

Here, the plurality of gate-electrode extensions 51 to 53, and 61 to 63 may be coupled together by the links 54 and 64 in the direction of the long side of the comb shape of the drain electrode 10 (or the source electrode 20). Thus, the plurality of gate-electrode extensions 51 to 53, and 61 to 63 may be coupled together by the links 54 and 64 having short wiring lengths and large widths. Accordingly, the inductance components and the impedance components generated in the first and third gate electrodes 40A and 40C may become very small when the additional capacitors Cadd are coupled to the first and third gate electrodes 40A and 40C. This leads to enhancement in the inputted electric power resistance characteristic and enhancement in the harmonic distortion characteristic when the semiconductor device 1-1 is applied to the antenna switch circuit as described later.

Furthermore, the plurality of gate-electrode extensions 51 to 53 on the drain-electrode 10 side may be coupled together by the link 54, to form the additional capacitor Cadd unitized into one. Also, the plurality of gate-electrode extensions 61 to 63 on the source-electrode 20 side may be coupled together by the link 64, to form the additional capacitor Cadd unitized into one. Accordingly, vacant space between the plurality of gate-electrode extensions 51 to 53, and 61 to 63 may be eliminated. This leads to effective utilization of device area, higher layout efficiency, and reduction in size of the semiconductor device 1-1.

As described, in this embodiment, the plurality of gate-electrode extensions 51 to 53, and 61 to 63 are projected from the first and third gate electrodes 40A and 40C. The plurality of gate-electrode extensions 51 to 53, and 61 to 63 are coupled together by the links 54 and 64 in the direction of the long side of the comb shape of the drain electrode 10 (or the source electrode 20). Hence, it is possible to suppress the increase in the resistance component and the inductance component generated in the first and third gate electrodes 40A and 40C when the additional capacitors Cadd are coupled to the first and third gate electrodes 40A and 40C. Accordingly, when the semiconductor device 1-1 is applied to the antenna switch circuit as described later, it is possible to stabilize the circuit operation, and to enhance the inputted electric power resistance characteristic and the harmonic distortion characteristic.

Moreover, the gate electrode 40 may be provided in the plurality. Hence, it is possible to reduce the area of the ohmic-contact electrode region, and to attain the shrink of the FET size, as compared to the case with multistage-coupled FETs of the single-gate structure including the gate electrode 40 in the singularity.

Furthermore, the drain-electrode contacts 74A to 74C, and 84A to 84C may be arranged to avoid the overlap with the gate-electrode extensions 51 to 53, and 61 to 63 in the horizontal plane. Hence, it is possible to reduce the flow-around of the current component, to shorten the current paths, and to avoid the increase in the resistance component.

It is to be noted that, in the forgoing embodiment, the description is given on a case in which the additional capacitors Cadd may be provided both on the drain-electrode 10 side of the first gate electrode 40A and on the source-electrode 20 side of the third gate electrode 40C. The additional capacitor Cadd may be, however, provided on either one of the drain-electrode 10 side of the first gate electrode 40A and the source-electrode 20 side of the third gate electrode 40C, depending on a circuit configuration.

Moreover, the forgoing embodiment may be applicable to various FETs. Examples of the semiconductor material may include Si-based, GaAs-based, and GaN-based semiconductor materials. Examples of FET structures may include MOSFET (Metal Oxide Semiconductor Field Effect Transistor), JFET (Junction Field Effect Transistor), PHEMT (Pseudo-morphic High Electron Mobility Transistor), JPHEMT, MISHEMT (Metal Insulator Semiconductor Pseudo-morphic High Electron Mobility Transistor), MIS-JPHEMT (Metal Insulator Semiconductor Junction Pseudo-morphic High Electron Mobility Transistor).

Second Embodiment (An Example in which the Drain Electrode and the Source Electrode Each Include a Widened Part)
<Configuration of Second Embodiment>

Figure 12:
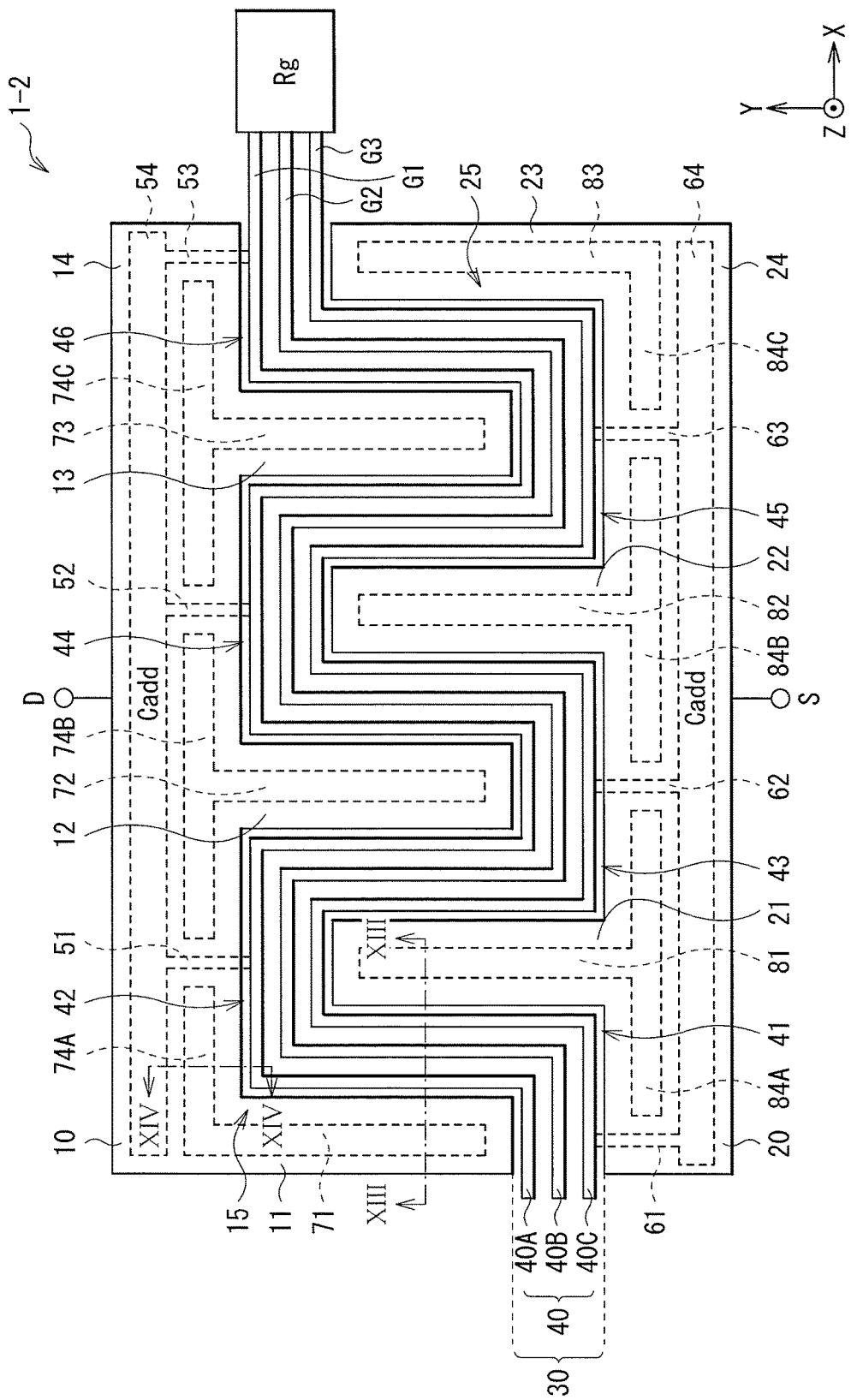
FIG. 12 is a plan view of a configuration of a semiconductor device according to a second embodiment of the disclosure.
Figure 13:
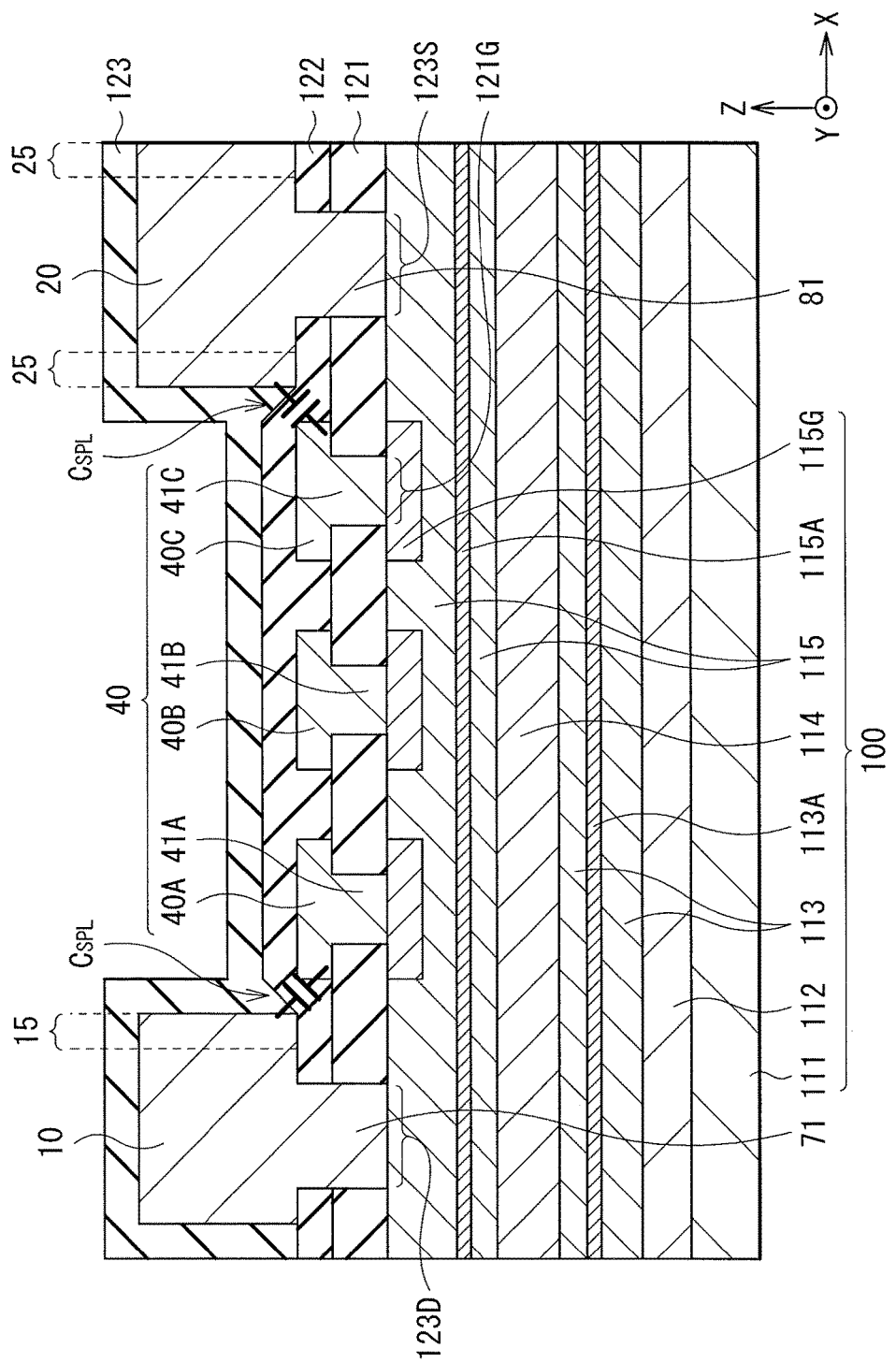
FIG. 13 is a cross-sectional view of the semiconductor device illustrated in FIG. 12, taken along a line XIII-XIII.
Figure 14:
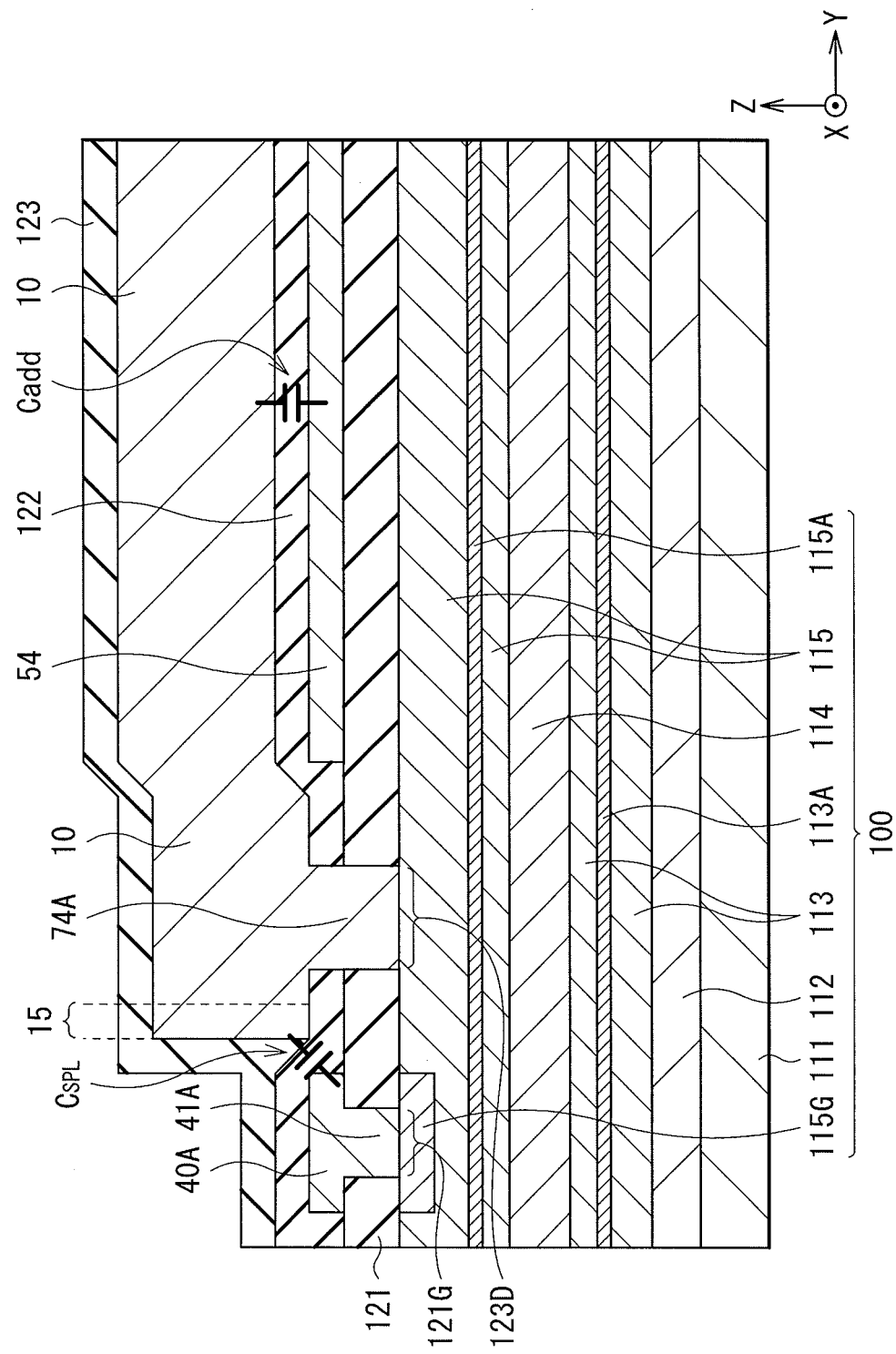
FIG. 14 is a cross-sectional view of the semiconductor device illustrated in FIG. 12, taken along a line XIV-XIV

FIG. 12 illustrates a plan configuration of a semiconductor device 1-2 according to a second embodiment of the disclosure. FIG. 13 illustrates a cross-sectional configuration, taken along an X-Z plane denoted by a line XIII-XIII, of the semiconductor device 1-2. FIG. 14 illustrates a cross-sectional configuration, taken along a Y-Z plane denoted by a line XIV-XIV, of the semiconductor device 1-2.

A difference of the semiconductor device 1-2 from the semiconductor device 1-1 described with reference to FIG. 1 may be as follows. The drain electrode 10 and the source electrode 20 may include widened parts 15 and 25 that are widened in a direction toward the gate electrode 40 in a planar shape. In other words, the comb-tooth parts 11 to 13 of the drain electrode 10 and the comb-tooth parts 21 to 23 of the source electrode 20 may be wider than those of the first embodiment. Otherwise, the semiconductor device 1-2 may have similar configurations to those of the first embodiment, and may be manufactured in a similar manner to the first embodiment.

Figure 15:
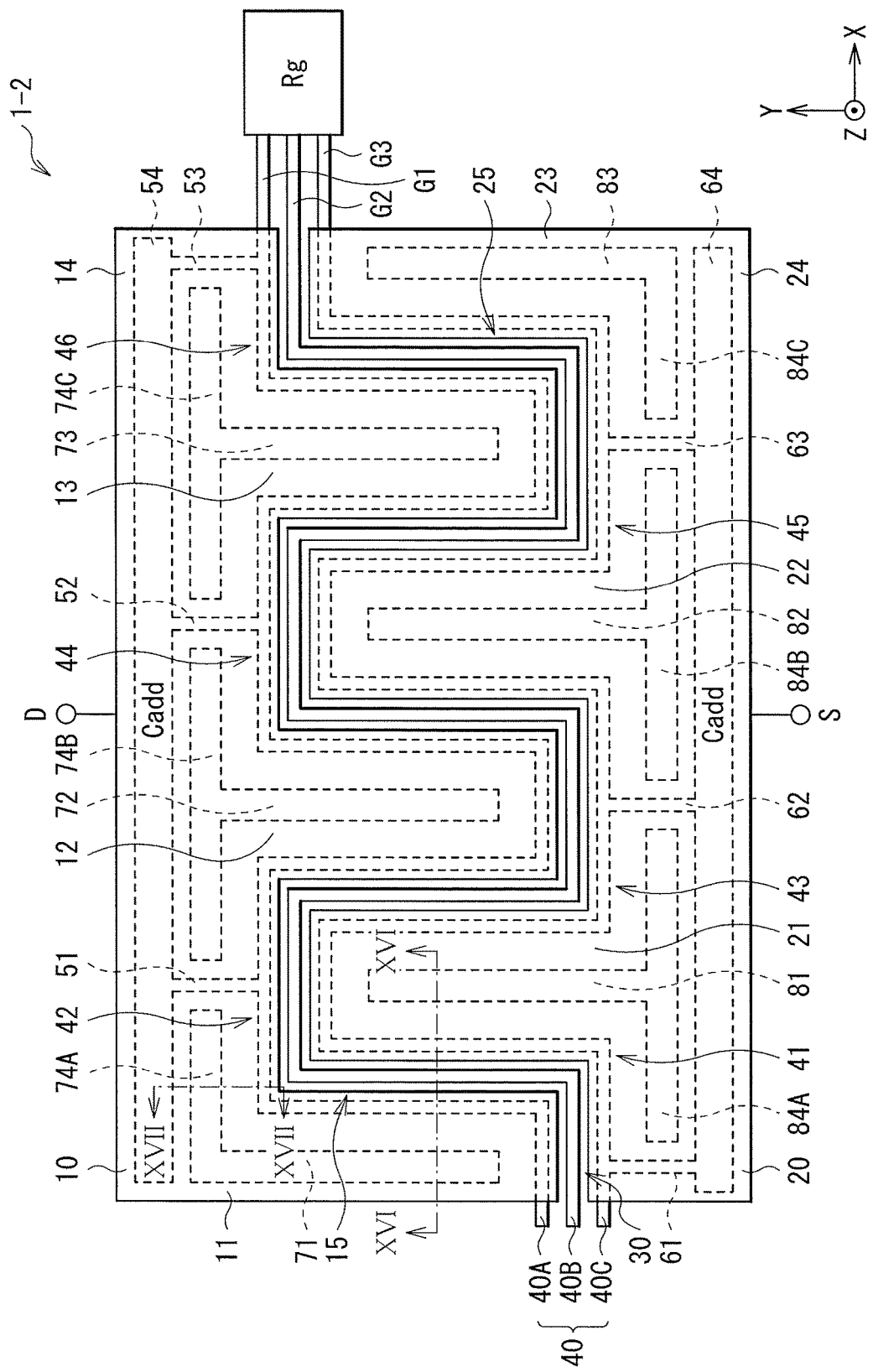
FIG. 15 is a plan view of a modification example of the semiconductor device illustrated in FIG. 12.
Figure 16:
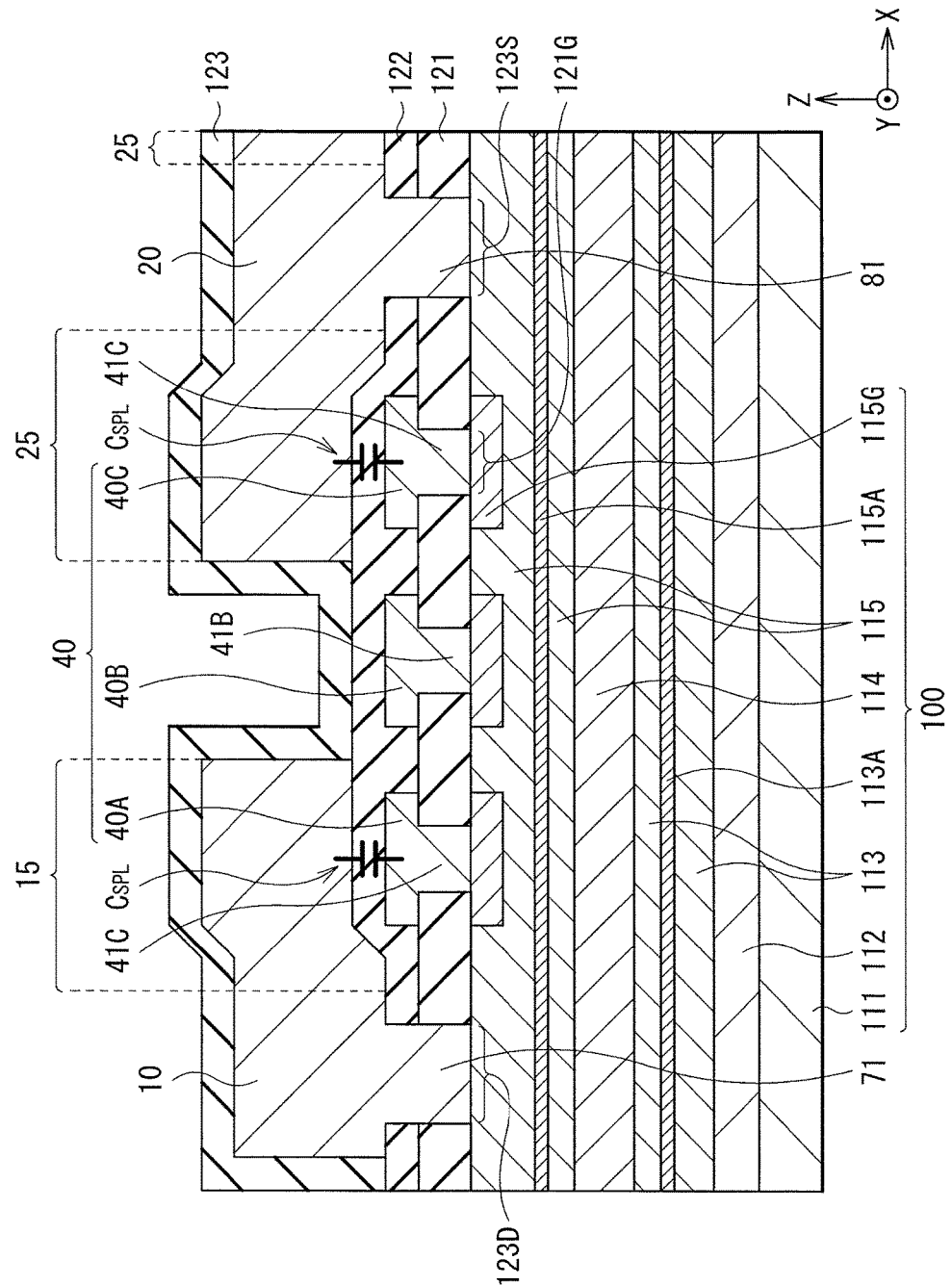
FIG. 16 is a cross-sectional view of the semiconductor device illustrated in FIG. 15, taken along a line XVI-XVI.
Figure 17:
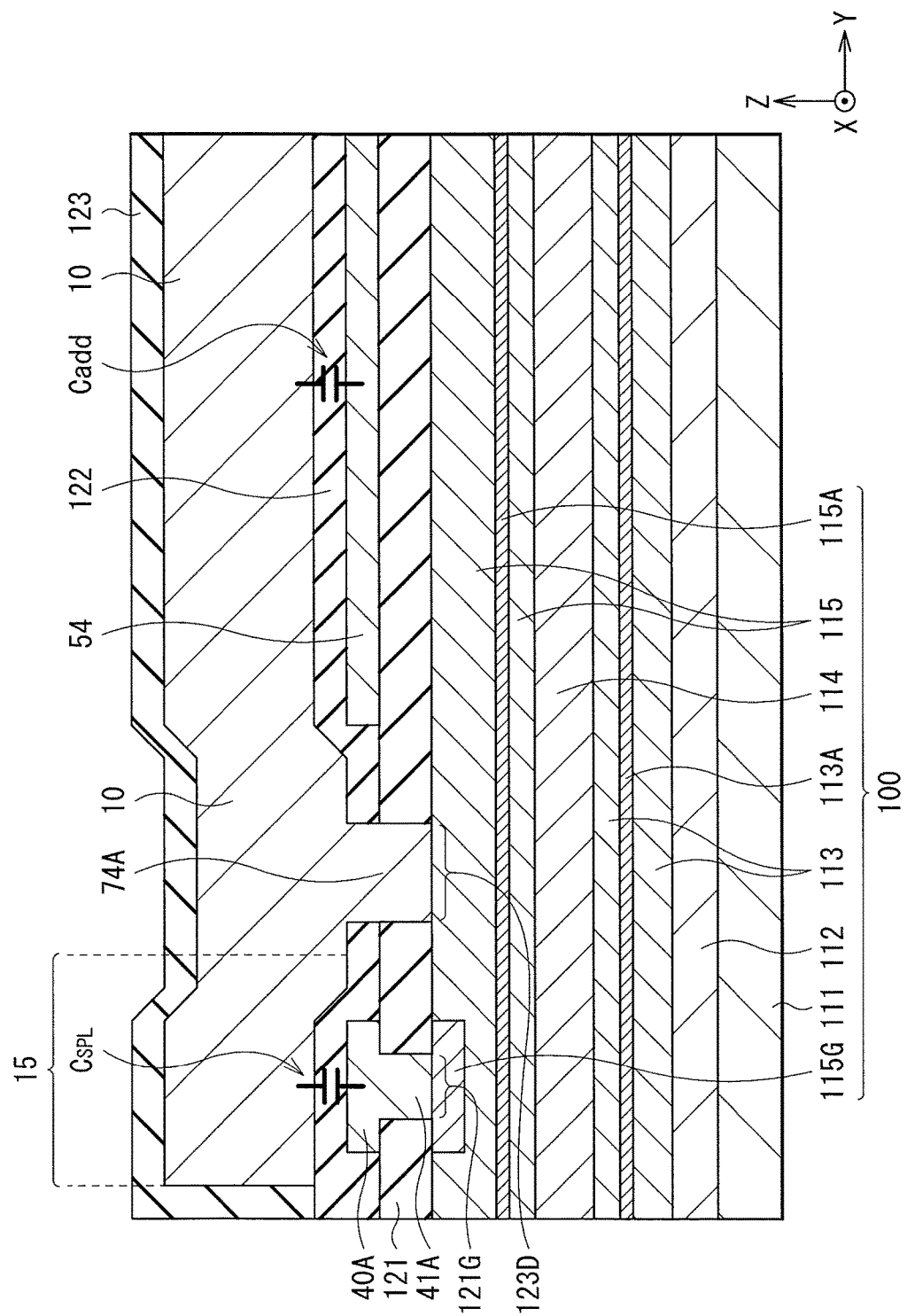
FIG. 17 is a cross-sectional view of the semiconductor device illustrated in FIG. 15, taken along a line XVII-XVII.

FIGS. 12 to 14 depict a case in which the widened parts 15 and 25 do not overlap the gate electrode 40 in the planar shape. However, as illustrated in FIGS. 15 to 17, the widened part 15 may be superposed on the first gate electrode 40A in the planar shape. Also, the widened part 25 may be superposed on the third gate electrode 40C.
<Workings and Effects of Second Embodiment>

In the semiconductor device 1-2, the drain electrode 10 and the source electrode may include the widened parts 15 and 25 that are widened in the direction toward the gate electrode 40 in the planar shape. Accordingly, the comb-tooth parts 11 to 13 of the drain electrode 10 may become close to the first gate electrode 40A, to generate a capacitor $C_{SPL}$ therebetween. Also, the comb-tooth parts 21 to 23 of the source electrode 20 may become closer to the third gate electrode 40C, to generate the capacitor $C_{SPL}$ therebetween. The capacitor $C_{SPL}$ may have similar effects to those of Cadd in FIG. 2, in terms of an equivalent circuit. It is therefore possible to reduce the size of the additional capacitor Cadd, i.e., the size of the links 54 and 64, by the size of the capacitor $C_{SPL}$. This results in the shrink of the FET size. Furthermore, the widths in the X direction of the comb-tooth parts 11 to 13, and 21 to 23 may become larger. It is therefore possible to expect an effect of the reduction in the resistance as well.

It is to be noted that, although not illustrated, widths in the Y direction of the link 54 on the drain-electrode 10 side and the link 64 on the source-electrode 20 side may be larger.

Moreover, in this embodiment, the description is given on a case in which the additional capacitors Cadd may be provided both on the drain-electrode 10 side of the first gate electrode 40A and on the source-electrode 20 side of the third gate electrode 40C. However, the additional capacitor Cadd may be provided on either one of the drain-electrode 10 side of the first gate electrode 40A and the source-electrode 20 side of the third gate electrode 40C, depending on the circuit configuration.

It is possible to combine this embodiment with the first embodiment. This makes it possible to obtain effects of the first embodiment as well, in addition to effects of the second embodiment.

Third Embodiment (An Example in which the Gate-Electrode Extensions Each are Provided at an Intersection of One of the Comb-Tooth Parts and the Long-Side Part of the Drain Electrode or the Source Electrode)
<Configuration of Third Embodiment>

Figure 18:
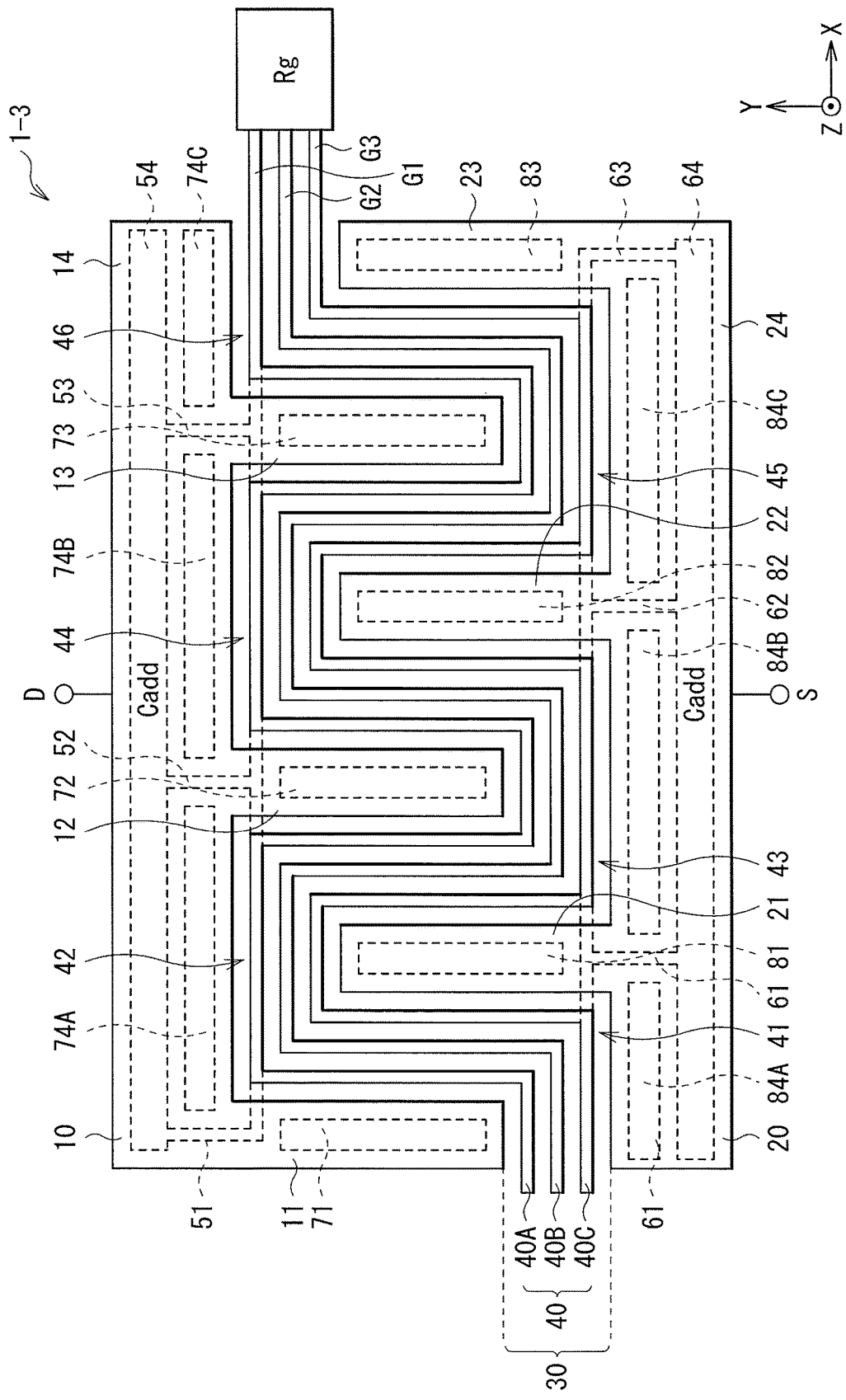
FIG. 18 is a plan view of a configuration of a semiconductor device according to a third embodiment of the disclosure.

FIG. 18 illustrates a plan configuration of a semiconductor device 1-3 according to a third embodiment of the disclosure. A difference of the semiconductor device 1-3 from the semiconductor device 1-1 of the first embodiment described with reference to FIG. 1 may be as follows. The gate-electrode extensions 51 to 53, and 61 to 63 each may be provided at an intersection of one of the comb-tooth parts 11 to 13 (or the comb-tooth parts 21 to 23) and the long-side part 14 (or the long-side part 24) of the drain electrode 10 (or the source electrode 20). Otherwise, the semiconductor device 1-3 may have similar configurations to those of the first embodiment.

As described, the gate-electrode extensions 51 to 53 each may be provided at the intersection of the comb-tooth part 11 (or the comb-tooth part 12 or 13) and the long-side part 14 of the drain electrode 10. The gate-electrode extensions 61 to 63 each may be provided at the intersection of the comb-tooth part 21 (or the comb-tooth part 22 or 23) and the long-side part 24 of the source electrode 20. Accordingly, the drain-electrode contacts 74A to 74C (or the source-electrode contacts 84A to 84C) and the bends 42, 44, and 46 of the first gate electrode 40A (or the bends 41, 43, and 45 of the third gate electrode 40C) may become in a side-by-side arrangement over a greater length. Hence, it is possible to suppress the increase in the resistance in vicinity of the bends 41 to 46 of the gate electrode.

The gate-electrode extension 51 may couple the bend 42 of the first gate electrode 40A to the link 54. The gate-electrode extension 52 may couple the adjacent two bends 42 and 44 of the first gate electrode 40A to the link 54. The gate-electrode extension 53 may couple the adjacent two bends 44 and 46 of the first gate electrode 40A to the link 54. There is no particular limitation on the planar shapes of the gate-electrode extensions 51 to 53. For example, the gate-electrode extensions 51 to 53 may be of, for example, a T-shape, a Y-shape, or an L-shape.

The gate-electrode extension 61 may couple the adjacent two bends 41 and 43 of the third gate electrode 40C to the link 64. The gate-electrode extension 62 may couple the adjacent two bends 43 and 45 of the third gate electrode 40C to the link 64. The gate-electrode extension 63 may couple the bend 45 of the third gate electrode 40C to the link 64. There is no particular limitation on the planar shapes of the gate-electrode extensions 61 to 63. For example, the gate-electrode extensions 61 to 63 may be of, for example, the T-shape or the L-shape.

Here, in one preferred example, the drain-electrode contacts 71 to 73, and 74A to 74C, and the source-electrode contacts 81 to 83, and 84A to 84C may be arranged to avoid the overlap with the gate-electrode extensions 51 to 53, and 61 to 63 in the horizontal plane. This makes it possible to reduce the flow-around of the current component, and to avoid the increase in the resistance component.

<Workings and Effects of Third Embodiment>

In the semiconductor device 1-3, the gate-electrode extensions 51 to 53 may be provided at the intersections of the respective comb-tooth parts 11 to 13 and the long-side part 14 of the drain electrode 10. Also, the gate-electrode extensions 61 to 63 may be provided at the intersections of the respective comb-tooth parts 21 to 23 and the long-side part 24 of the source electrode 20. Hence, it is possible to suppress the increase in the resistance in the vicinity of the bends 41 to 46 of the gate electrode 40.

It is to be noted that, in this embodiment, the description is given on a case in which the additional capacitors Cadd may be provided both on the drain-electrode 10 side of the first gate electrode 40A and on the source-electrode 20 side of the third gate electrode 40C. However, the additional capacitor Cadd may be provided on either one of the drain-electrode 10 side of the first gate electrode 40A and the source-electrode 20 side of the third gate electrode 40C, depending on the circuit configuration.

This embodiment is not limited to application to the first embodiment. It is possible to combine this embodiment with the second embodiment. This makes it possible to obtain effects of the second embodiment as well, in addition to effects of this embodiment.

Fourth Embodiment (A Single-Gate Structure)

Figure 19:
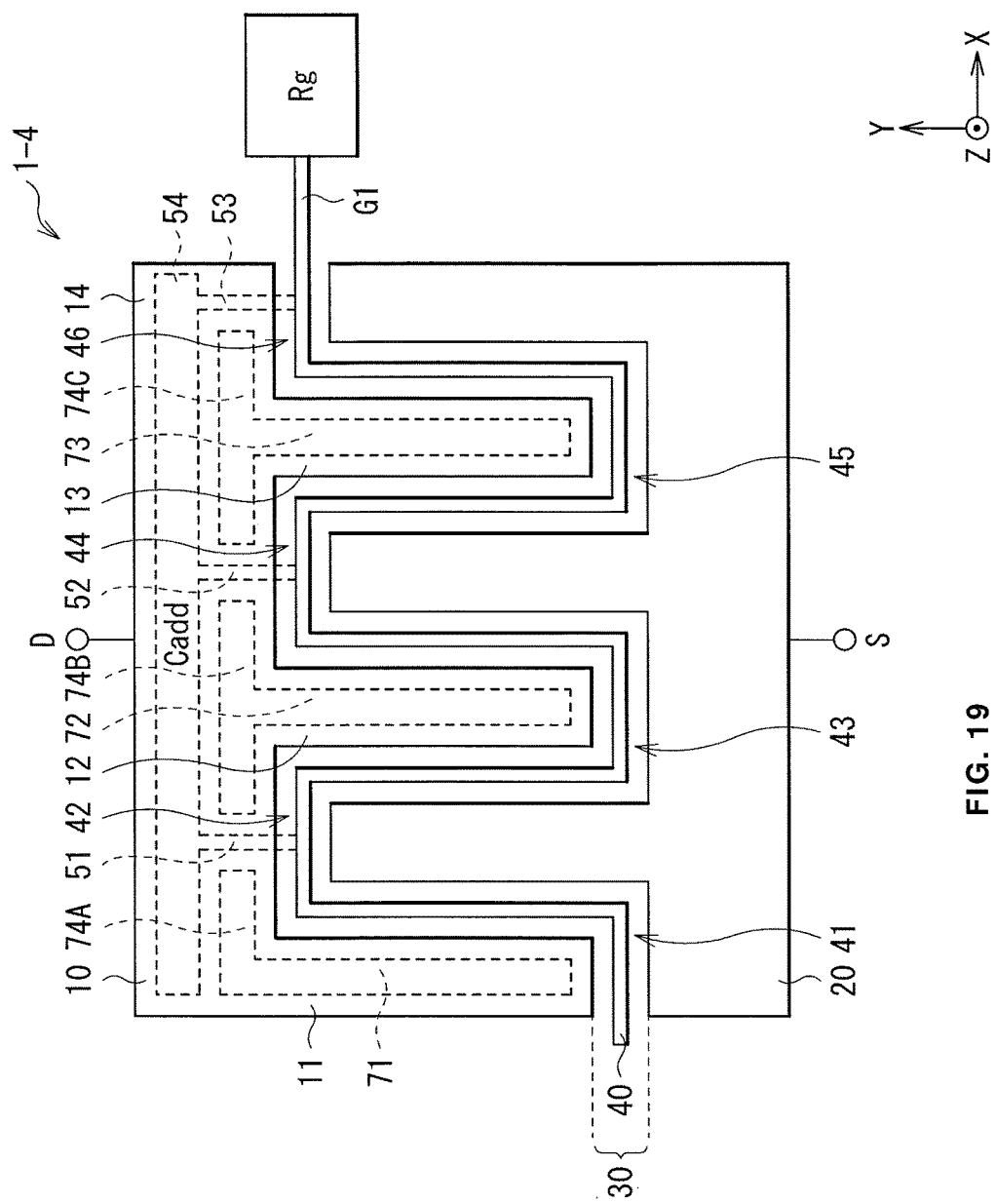
FIG. 19 is a plan view of a configuration of a semiconductor device according to a fourth embodiment of the disclosure.

FIG. 19 illustrates a plan configuration of a semiconductor device 1-4 according to a fourth embodiment of the disclosure. The semiconductor device 1-4 may have similar configurations to those of the first embodiment, and may be manufactured in a similar manner to the first embodiment, except that the gate electrode 40 may be provided in a singularity (a single-gate structure).

Figure 20:
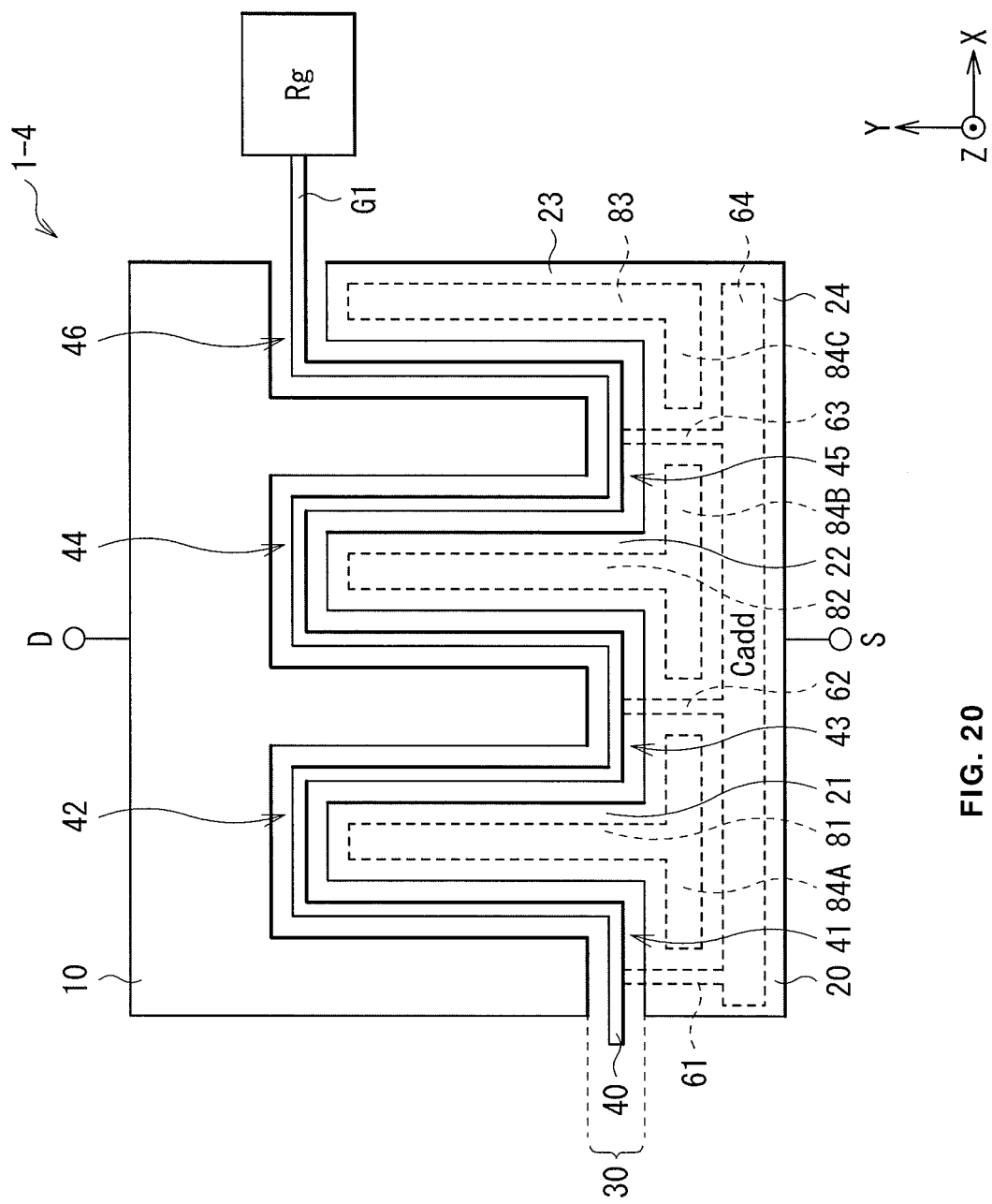
FIG. 20 is a plan view of a modification example of the semiconductor device illustrated in FIG. 19.

With the gate electrode 40 provided in the singularity, it is sufficient that the additional capacitor Cadd (the gate-electrode extensions 51 to 53, and 61 to 63, and the links 54 and 64) may be provided on either one of the drain-electrode 10 side and the source-electrode 20 side of the gate electrode 40. FIG. 19 depicts a case in which the additional capacitor Cadd may be provided on the drain-electrode 10 side of the gate electrode 40. In one alternative, as illustrated in FIG. 20, the additional capacitor Cadd may be provided on the source-electrode 20 side of the gate electrode 40, depending on the circuit configuration.

Workings and effects of the semiconductor device 1-4 according to the embodiment may be similar to those of the first embodiment.

This embodiment is not limited to the application to the first embodiment. This embodiment may be combined with the second or third embodiment. This makes it possible to obtain effects of the second or third embodiment as well, in addition to effects of the embodiment.

Application Examples (Antenna Switch Circuits and a Wireless Communication Apparatus)

The semiconductor devices 1-1 to 1-4 as described in the forgoing embodiments may be used in, for example, a wireless communication apparatus in a mobile communication system or any other communication system. In one specific example, the semiconductor devices 1-1 to 1-4 as described in the forgoing embodiments may be used as an antenna switch of the wireless communication apparatus. In particular, the semiconductor devices 1-1 to 1-4 as described in the forgoing embodiments may exhibit their effects in, for example, the wireless communication apparatus having communication frequency of a UHF (Ultra High Frequency) band or higher.

In other words, as described in the first to fourth embodiments, the semiconductor devices 1-1 to 1-4 may have the optimal inputted electric power resistance characteristic and the optimal harmonic distortion characteristic. Utilization of the semiconductor devices 1-1 to 1-4 as the antenna switch of the wireless communication apparatus makes it possible to attain size reduction and lower power consumption of the wireless communication apparatus. In particular, in a mobile communication terminal device, the reduction in a device size and longer time of use owing to the lower power consumption makes it possible to attain enhanced portability.

Figure 21:
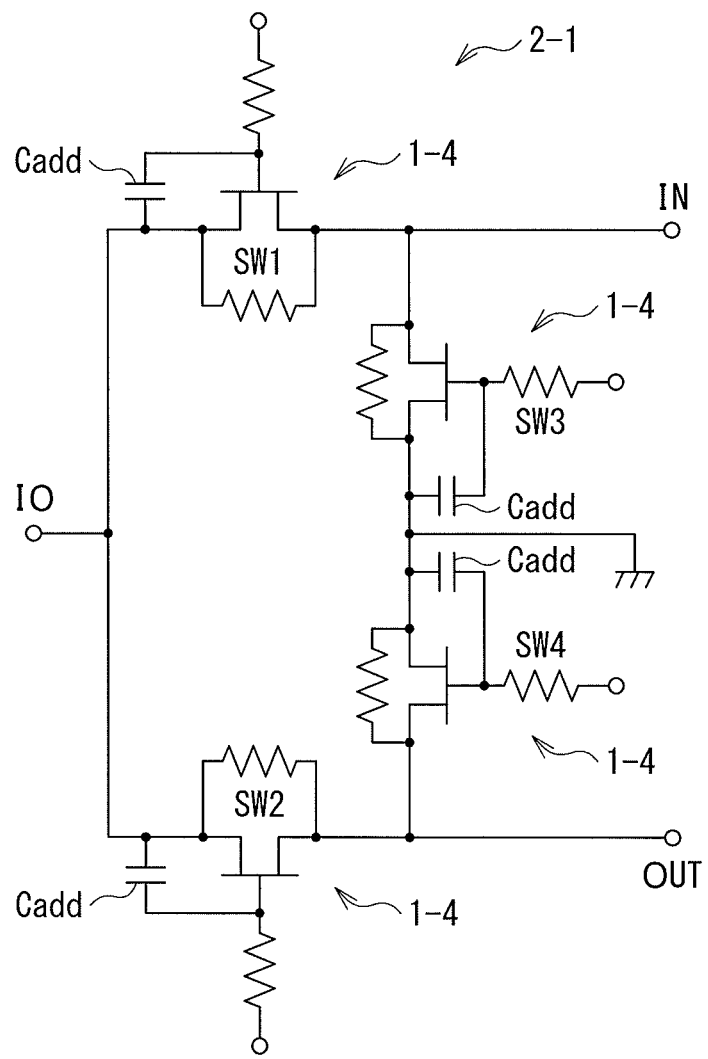
FIG. 21 is a circuit diagram of an example of an antenna switch circuit.

FIG. 21 illustrates one example of the antenna switch circuit. The antenna switch circuit 2-1 may be used in the mobile communication system such as the mobile phone. The antenna switch circuit 2-1 may include, for example, a first terminal IN, a second terminal IO, a third terminal OUT, a first switching element SW1, and a second switching element SW2.

The first terminal IN may be supplied with a transmission signal. The second terminal 10 may be coupled to an antenna. The third terminal OUT may output a reception signal received by the antenna. The first switching element SW1 may be coupled between the first terminal IN and the second terminal 10. The second switching element SW2 may be coupled between the second terminal IO and the third terminal OUT. One or both of the first switching element SW1 and the second switching element SW2 may include the semiconductor device 1-4 according to the fourth embodiment.

A third switching element SW3 may be coupled between the first terminal IN and a power supply (that may be grounded in this example). A fourth switching element SW4 may be coupled between the third terminal OUT and the power supply (that may be grounded in this example). One or both of the third switching element SW3 and the fourth switching element SW4 may include the semiconductor device 1-4 according to the fourth embodiment.

In each of the semiconductor devices 1-4, the additional capacitor Cadd may be coupled between the gate electrode 40 and the drain electrode 10, or between the gate electrode 40 and the source electrode 20.

In the antenna switch circuit 2-1, during transmission, i.e., when the transmission signal is outputted to the antenna from a transmission unit of the wireless communication apparatus, the first switching element SW1 and the fourth switching element SW4 may become conductive, while the second switching element SW2 and the third switching element SW3 may become non-conductive. At this occasion, the transmission signal may be inputted through the first terminal IN, and outputted to the second terminal IO through the first switching element SW1.

During reception, i.e., when the signal received by the antenna is inputted to a reception unit of the wireless communication apparatus, the first switching element SW1 and the fourth switching element SW4 may become non-conductive, while the second switching element SW2 and the third switching element SW3 may become conductive. At this occasion, the reception signal received by the antenna may be inputted through the second terminal IO, and outputted to the third terminal OUT through the second switching element SW2.

Figure 22:
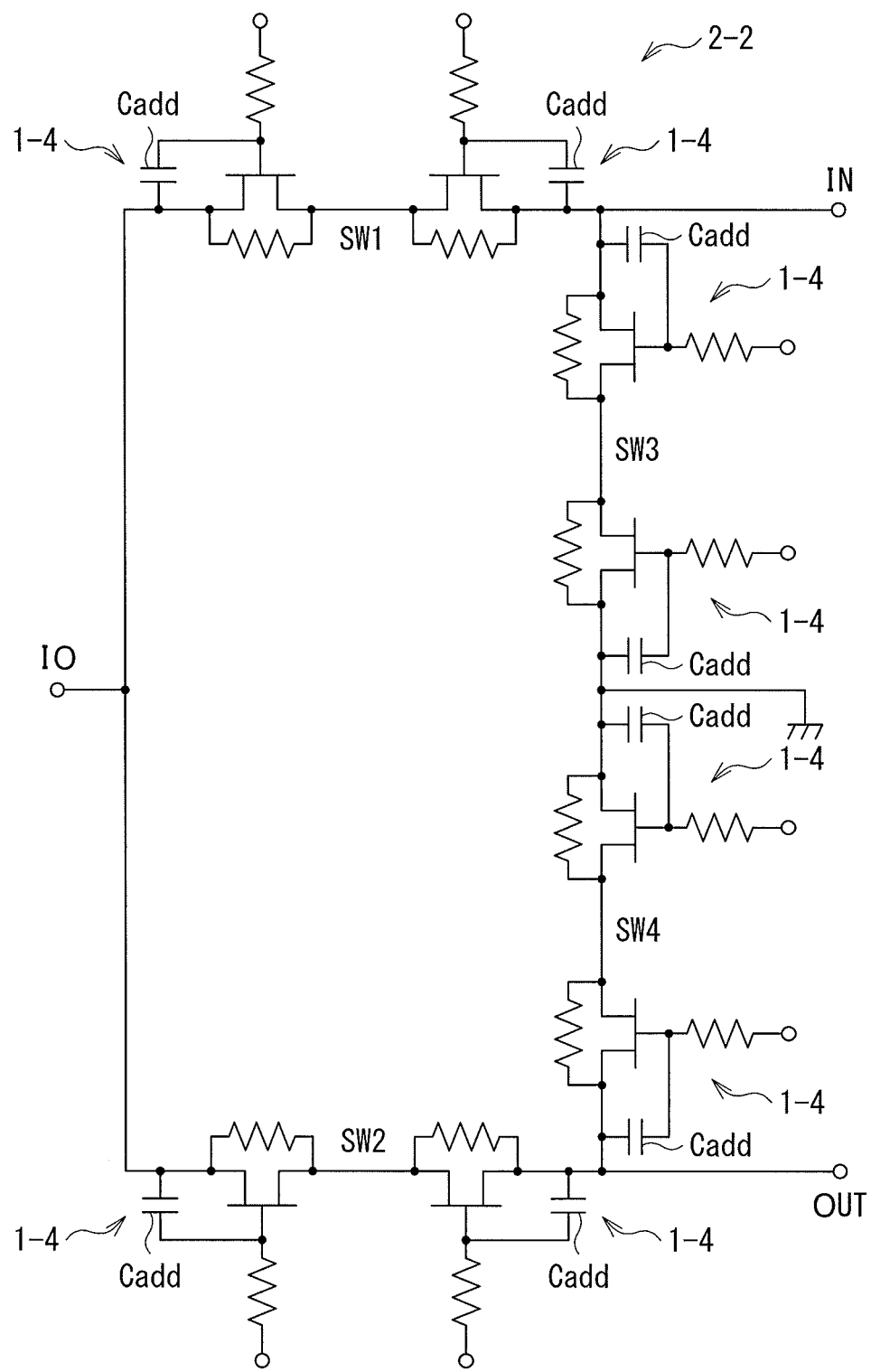
FIG. 22 is a circuit diagram of another example of the antenna switch circuit.

FIG. 22 illustrates another example of the antenna switch circuit. In the antenna switch circuit 2-2, at least one of the first to fourth switching elements SW1 to SW4 may include, for example, the multistage-coupled (for example, two-stage-coupled, in FIG. 22) semiconductor devices 1-4 according to the fourth embodiment. Hence, in the antenna switch circuit 2-2, it is possible to enhance the electric power resistance.

In one specific example, the first switching element SW1 may include the plurality of semiconductor devices 1-4 that are coupled in series and each may include the single gate electrode 40 between the source electrode 20 and the drain electrode 10. The first switching element SW1 may have a stacked structure in which the source electrode 20, the gate electrode 40, the drain electrode 10, the source electrode 20, the gate electrode 40, and the drain electrode 10 may be arranged in the order named. This may also apply to the second to fourth switching elements SW2 to SW4.

Moreover, in each of the first to fourth switching elements SW1 to SW4, the additional capacitors Cadd may be coupled on either the source-electrode 20 side or the drain-electrode 10 side of the semiconductor devices 1-4 that are located on both ends of the stacked structure.

Figure 23:
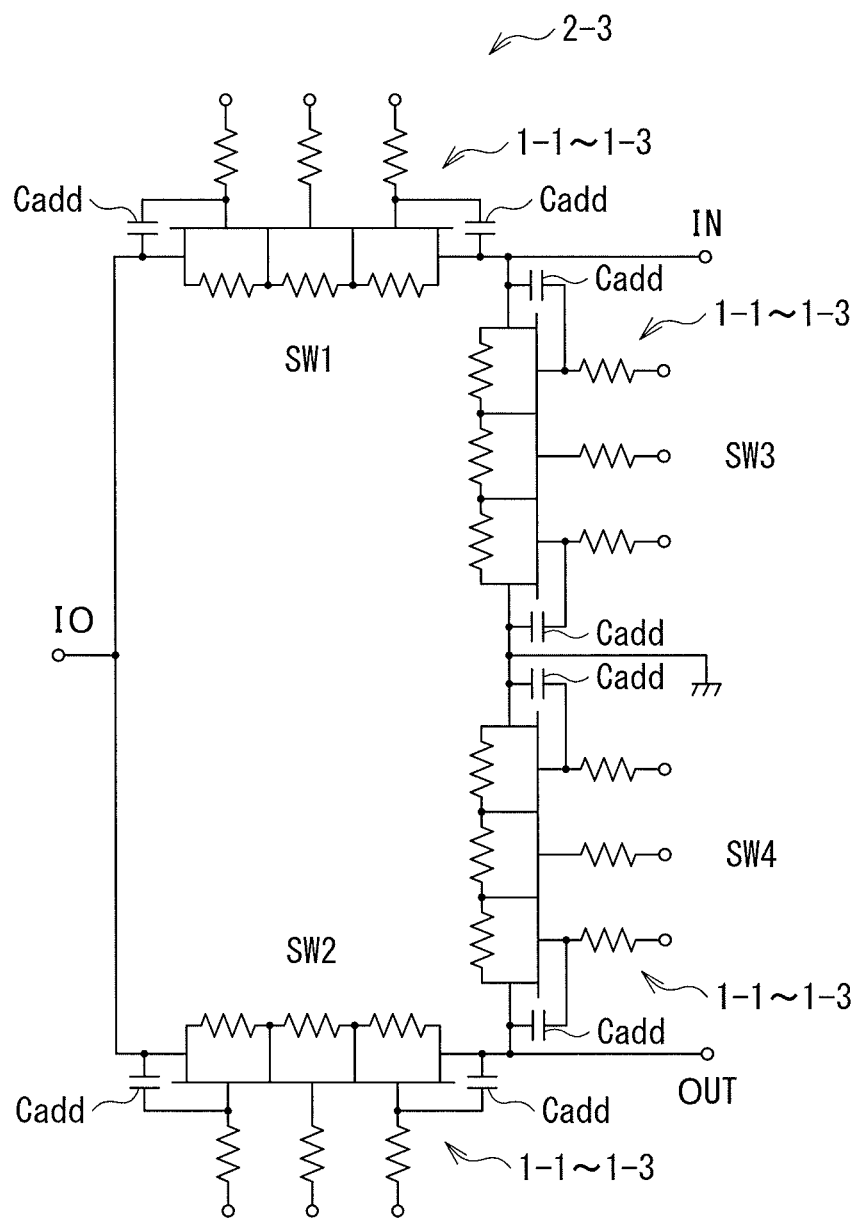
FIG. 23 is a circuit diagram of still another example of the antenna switch circuit.

FIG. 23 illustrates still another example of the antenna switch circuit. In the antenna switch circuit 2-3, at least one of the first to fourth switching elements SW1 to SW4 may include, for example, any one of the semiconductor devices 1-1 to 1-3 according to the first to third embodiments. Hence, in the antenna switch circuit 2-3, it is possible to enhance the electric power resistance.

Moreover, in each of the first to fourth switching elements SW1 to SW4, each of the semiconductor devices 1-1, 1-2, or 1-3 may include the gate electrode 40 in the plurality. The additional capacitors Cadd may be coupled on one or both of the drain-electrode 10 side and the source-electrode 20 side of the plurality of gate electrodes 40 of each of the semiconductor devices 1-1, 1-2, or 1-3.

Figure 24:
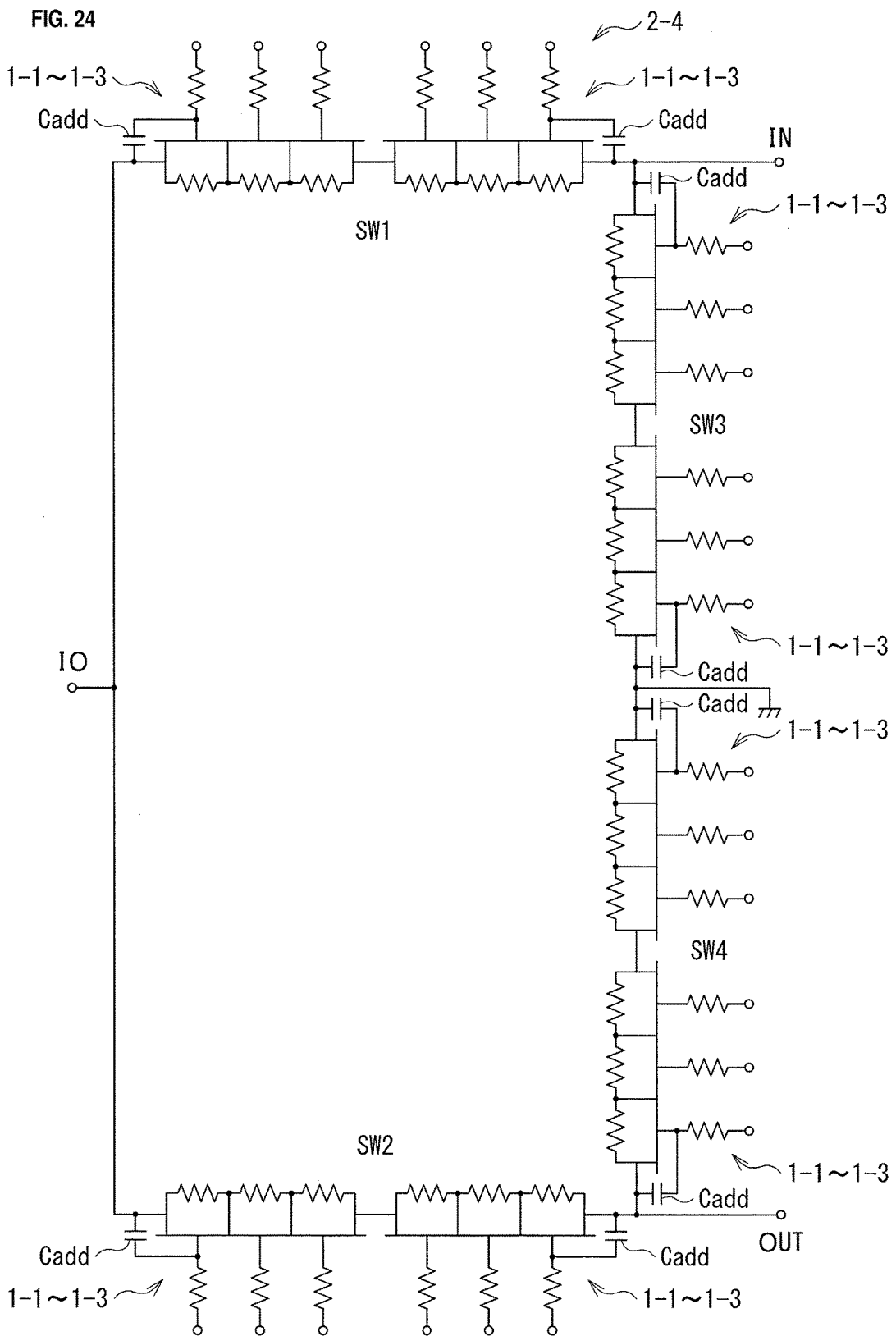
FIG. 24 is a circuit diagram of still another example of the antenna switch circuit.

FIG. 24 illustrates still another example of the antenna switch circuit. In the antenna switch circuit 2-4, the first to fourth switching elements SW1 to SW4 may include, for example, any one of the multistage-coupled (for example, two-stage-coupled, in FIG. 24) semiconductor devices 1-1 to 1-3 according to the first to third embodiments. Hence, in the antenna switch circuit 2-4, it is possible to enhance the electric power resistance even more.

In one specific example, the first switching element SW1 may include the plurality of semiconductor devices 1-1, 1-2, or 1-3 that are coupled in series. Each of the plurality of semiconductor devices 1-1, 1-2, or 1-3 may include the gate electrode 40 in the plurality between the source electrode 20 and the drain electrode 10. The first switching element SW1 may have the stacked structure in which, for example, the source electrode 20, the gate electrode 40, the gate electrode 40, the gate electrode 40, the drain electrode 10, the source electrode 20, the gate electrode 40, the gate electrode 40, the gate electrode 40, and the drain electrode 10 may be arranged in the order named. This may also apply to the second to fourth switching elements SW2 to SW4.

Moreover, in each of the first to fourth switching elements SW1 to SW4, each of the semiconductor devices 1-1, 1-2, or 1-3 may include the gate electrode 40 in the plurality. The additional capacitors Cadd may be coupled on one or both of the drain-electrode 10 side and the source-electrode 20 side of the plurality of gate electrodes 40 of each of the semiconductor devices 1-1, 1-2, or 1-3.

It is to be noted that, although not illustrated, the antenna switch circuit may have a circuit configuration that includes the semiconductor device 1-4 of the single-gate structure according to the fourth embodiment and any one of the semiconductor devices 1-1 to 1-3 of the multi-gate structure according to the first to third embodiments.

Figure 25:
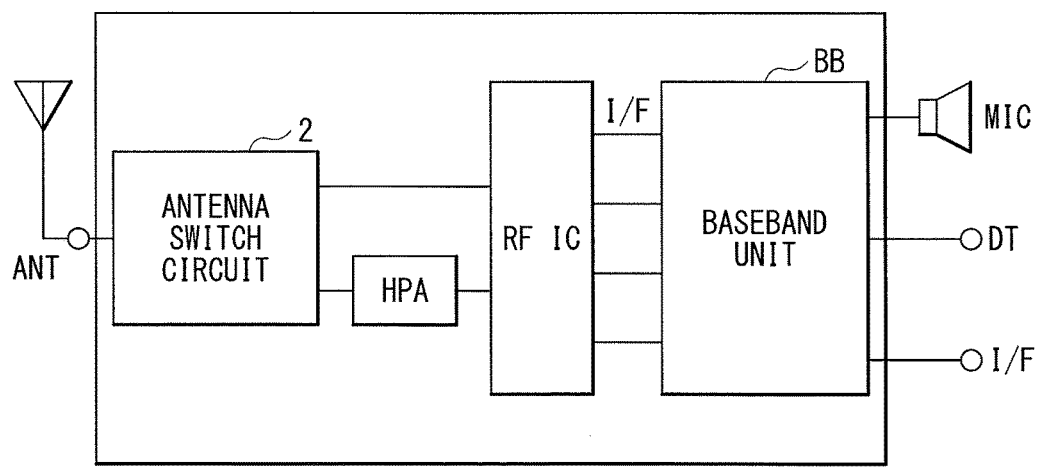
FIG. 25 is a block diagram of an example of a wireless communication apparatus.

FIG. 25 illustrates one example of the wireless communication apparatus. The wireless communication apparatus 3-1 may be, for example, a mobile phone system that may have multiple functions such as sound, data communication, and LAN coupling. The wireless communication apparatus 3-1 may include, for example, an antenna ANT, an antenna switch circuit 2, a high power amplifier HPA, a radio frequency integrated circuit RFIC, a baseband unit BB, a sound output unit MIC, a data output unit DT, an interface I/F (for example, wireless LAN (W-LAN; Wireless Local Area Network), Bluetooth (registered trademark), and other communication methods). The antenna switch circuit 2 may include any one of the antenna switch circuits 2-1 to 2-4 illustrated in FIGS. 21 to 24. The radio frequency integrated circuit RFIC and the baseband unit BB may be coupled through the interface I/F.

In the wireless communication apparatus 3-1, during transmission, i.e., when the transmission signal is outputted to the antenna ANT from the transmission unit of the wireless communication apparatus 3-1, the transmission signal outputted from the baseband unit BB may be outputted to the antenna ANT through the radio frequency integrated circuit RFIC, the high power amplifier HPA, and the antenna switch circuit 3.

During reception, i.e., when the signal received by the antenna ANT is inputted to the reception unit of the wireless communication apparatus, the reception signal may be inputted to the baseband unit BB through the antenna switch circuit 2 and the radio frequency integrated circuit RFIC. The signal processed by the baseband unit BB may be outputted from output units such as the sound output unit MIC, the data output unit DT, and the interface I/F.

Although description has been made by giving the example embodiments as mentioned above, the contents of the disclosure are not limited to the above-mentioned example embodiments and may be modified in a variety of ways.

For example, in the forgoing example embodiments, description has been given on an example in which, for example, the plurality of gate-electrode extensions 51 to 53 may be extended from the drain electrode 10, and the plurality of gate-electrode extensions 51 to 53 may be coupled together by the link 54. However, in one alternative example, the single gate-electrode extension 51 may be extended from the drain electrode 10, and the link 54 may be coupled to the single gate-electrode extension 51.

For example, in the forgoing example embodiments, description has been given on specific configurations of the semiconductor devices 1-1 to 1-4, the antenna switch circuits 2-1 to 2-4, and the wireless communication apparatus 3-1. However, the semiconductor devices 1-1 to 1-4, the antenna switch circuits 2-1 to 2-4, and the wireless communication apparatus 3-1 are not limited to those that include all the components as described. Also, some of the components may be substituted by another component or other components.

Moreover, shapes, materials, and thicknesses, or deposition methods or other methods of the layers as described in the forgoing example embodiments are not limited to as exemplified above, but other shapes, materials, and thicknesses, or other deposition methods may be adopted.

It is to be noted that effects described herein are merely exemplified and not limitative, and effects of the disclosure may be other effects or may further include other effects.

The contents of the technology may have the following configurations.

(1)
A semiconductor device, including:
a drain electrode and a source electrode that have a planar shape of combs in mesh with each other;
a gate electrode that is provided between the drain electrode and the source electrode, and has a meandering planar shape:
one or more gate-electrode extensions that are projected from the gate electrode; and
a link that is confronted with one or both of the drain electrode and the source electrode, and couples the one or more gate-electrode extensions together.
(2)
The semiconductor device according to (1),
wherein the gate electrode is provided in a plurality.
(3)
The semiconductor device according to (1) or (2),
wherein the one or more gate-electrode extensions and the link are provided on one or both of drain-electrode side of the gate electrode and source-electrode side of the gate electrode.
(4)
The semiconductor device according to any one of (1) to (3), further including:
a semiconductor layer;
a drain-electrode contact that couples the semiconductor layer and the drain electrode; and
a source-electrode contact that couples the semiconductor layer and the source electrode,
wherein the drain-electrode contact and the source-electrode contact are arranged to avoid overlap with the gate-electrode extensions in a horizontal plane.
(5)
The semiconductor device according to any one of (1) to (4),
wherein the drain electrode and the source electrode each include a plurality of comb-tooth parts and a long-side part, and
the gate-electrode extensions each are provided in crossing relation to the long-side part of the drain electrode or the source electrode.
(6)
The semiconductor device according to any one of (1) to (4),
wherein the drain electrode and the source electrode each include a plurality of comb-tooth parts and a long-side part, and the gate-electrode extensions each are provided at an intersection of one of the plurality of comb-tooth parts and the long-side part of the drain electrode or the source electrode.

(7)

The semiconductor device according to any one of (1) to (6), wherein one or both of the drain electrode and the source electrode include a widened part that is widened in a direction toward the gate electrode in a horizontal plane.

(8)

The semiconductor device according to any one of (1) to (7), wherein the widened part overlaps the gate electrode in the horizontal plane.

(9)

An antenna switch circuit, including:

a first terminal supplied with a transmission signal;

a second terminal coupled to an antenna:

a third terminal that outputs a reception signal received by the antenna:

a first switching element coupled between the first terminal and the second terminal; and a second switching element coupled between the second terminal and the third terminal, the first switching element becoming conductive while the second switching element becoming non-conductive during transmission, and the first switching element becoming non-conductive while the second switching element becoming conductive during reception, and one or both of the first switching element and the second switching element including a drain electrode and a source electrode that have a planar shape of combs in mesh with each other.

a gate electrode that is provided between the drain electrode and the source electrode, and has a meandering planar shape, one or more gate-electrode extensions that are projected from the gate electrode, and a link that is confronted with one or both of the drain electrode and the source electrode, and couples the one or more gate-electrode extensions together.

(10)

The antenna switch circuit according to (9), wherein one or both of the first switching element and the second switching element include the gate electrode in a plurality.

(11)

The antenna switch circuit according to (9) or (10), wherein one or both of the first switching element and the second switching element include a plurality of switching elements coupled in multiple stages.

(12)

A wireless communication apparatus, including:

an antenna; and an antenna switch circuit that performs switching between input of a transmission signal to the antenna and output of a reception signal received by the antenna, the antenna switch circuit including a first terminal supplied with the transmission signal;

a second terminal coupled to the antenna;

a third terminal that outputs the reception signal received by the antenna;

a first switching element coupled between the first terminal and the second terminal; and a second switching element coupled between the second terminal and the third terminal, the first switching element becoming conductive while the second switching element becoming non-conductive during transmission, and the first switching element becoming non-conductive while the second switching element becoming conductive during reception, and one or both of the first switching element and the second switching element including a drain electrode and a source electrode that have a planar shape of combs in mesh with each other, a gate electrode that is provided between the drain electrode and the source electrode, and has a meandering planar shape, one or more gate-electrode extensions that are projected from the gate electrode, and a link that is confronted with one or both of the drain electrode and the source electrode, and couples the one or more gate-electrode extensions together.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device, comprising:

a drain electrode and a source electrode that have a planar shape of combs in mesh with each other;

a gate electrode that is provided between the drain electrode and the source electrode, wherein the gate electrode has a meandering planar shape;

two or more gate-electrode extensions, wherein each of the two or more gate-electrode extensions are projected outward from bends of the gate electrode, wherein a contact of one or more of the drain electrode and the source electrode avoid overlap with the gate-electrode extensions in a horizontal plane; and a link that is confronted with one or both of the drain electrode and the source electrode, wherein the link couples the two or more gate-electrode extensions together.

2. The semiconductor device according to claim 1, wherein the gate electrode is provided in a plurality.

3. The semiconductor device according to claim 1, wherein the two or more gate-electrode extensions and the link are provided on one or both of a drain-electrode side of the gate electrode and a source-electrode side of the gate electrode.

4. The semiconductor device according to claim 1, further comprising:

a semiconductor layer;

a drain-electrode contact that couples the semiconductor layer and the drain electrode; and a source-electrode contact that couples the semiconductor layer and the source electrode.

5. The semiconductor device according to claim 1, wherein the drain electrode and the source electrode each include a plurality of comb-tooth parts and a long-side part, and the two or more gate-electrode extensions each are provided in crossing relation to the long-side part of one of the drain electrode and the source electrode.

6. The semiconductor device according to claim 1, wherein the drain electrode and the source electrode each include a plurality of comb-tooth parts and a long-side part, and the two or more gate-electrode extensions each are provided at an intersection of one of the plurality of comb-tooth parts and the long-side part of one of the drain electrode and the source electrode.

7. The semiconductor device according to claim 1, wherein one or both of the drain electrode and the source electrode include a widened part that is widened in a direction toward the gate electrode in a horizontal plane.

8. The semiconductor device according to claim 7, wherein the widened part overlaps the gate electrode in the horizontal plane.

9. An antenna switch circuit, comprising:
a first terminal supplied with a transmission signal;
a second terminal coupled to an antenna;
a third terminal that outputs a reception signal received by the antenna;
a first switching element coupled between the first terminal and the second terminal; and
a second switching element coupled between the second terminal and the third terminal,
the first switching element becoming conductive while the second switching element becoming non-conductive during transmission, and the first switching element becoming non-conductive while the second switching element becoming conductive during reception, and
one or both of the first switching element and the second switching element including
a drain electrode and a source electrode that have a planar shape of combs in mesh with each other,
a gate electrode that is provided between the drain electrode and the source electrode, wherein the gate electrode has a meandering planar shape,
two or more gate-electrode extensions, wherein each of the two or more gate-electrode extensions are projected outward from bends of the gate electrode, wherein a contact of one or more of the drain electrode and the source electrode avoid overlap with the gate-electrode extensions in a horizontal plane, and
a link that is confronted with one or both of the drain electrode and the source electrode, wherein the link couples the two or more gate-electrode extensions together.

10. The antenna switch circuit according to claim 9, wherein one or both of the first switching element and the second switching element include the gate electrode in a plurality.

11. The antenna switch circuit according to claim 9, wherein one or both of the first switching element and the second switching element include a plurality of switching elements coupled in multiple stages.

12. A wireless communication apparatus, comprising:
an antenna; and
an antenna switch circuit that performs switching between input of a transmission signal to the antenna and output of a reception signal received by the antenna,
the antenna switch circuit including
a first terminal supplied with the transmission signal;
a second terminal coupled to the antenna;
a third terminal that outputs the reception signal received by the antenna;
a first switching element coupled between the first terminal and the second terminal; and
a second switching element coupled between the second terminal and the third terminal,
the first switching element becoming conductive while the second switching element becoming non-conductive during transmission, and the first switching element becoming non-conductive while the second switching element becoming conductive during reception, and
one or both of the first switching element and the second switching element including
a drain electrode and a source electrode that have a planar shape of combs in mesh with each other,
a gate electrode that is provided between the drain electrode and the source electrode, wherein the gate electrode has a meandering planar shape, two or more gate-electrode extensions, wherein each of the two or more gate-electrode extensions are projected outward from bends of the gate electrode, wherein a contact of one or more of the drain electrode and the source electrode avoid overlap with the gate-electrode extensions in a horizontal plane, and a link that is confronted with one or both of the drain electrode and the source electrode, and couples the two or more gate-electrode extensions together.

* * * * *